United States Patent
Dong et al.

(10) Patent No.: US 8,982,626 B2
(45) Date of Patent: Mar. 17, 2015

(54) PROGRAM AND READ OPERATIONS FOR 3D NON-VOLATILE MEMORY BASED ON MEMORY HOLE DIAMETER

(71) Applicant: SanDisk Technologies Inc., Plano, TX (US)

(72) Inventors: Yingda Dong, San Jose, CA (US); Wendy Ou, San Jose, CA (US); Man L Mui, Santa Clara, CA (US); Masaaki Higashitani, Cupertino, CA (US)

(73) Assignee: SanDisk Technologies Inc., Plano, TX (US)

( * ) Notice: Subject to any disclaimer, the term of this patent is extended or adjusted under 35 U.S.C. 154(b) by 10 days.

(21) Appl. No.: 13/910,377

(22) Filed: Jun. 5, 2013

(65) Prior Publication Data
US 2014/0362641 A1    Dec. 11, 2014

(51) Int. Cl.
  G11C 11/34    (2006.01)
  G11C 16/10    (2006.01)
  G11C 16/04    (2006.01)
(52) U.S. Cl.
  CPC .......... G11C 16/107 (2013.01); G11C 16/0483 (2013.01)
  USPC ............. 365/185.17; 365/185.18; 365/185.22
(58) Field of Classification Search
  USPC ............................ 365/185.17, 185.18, 185.22
  See application file for complete search history.

(56) References Cited

U.S. PATENT DOCUMENTS

| | | | |
|---|---|---|---|
| 6,566,703 B1 * | 5/2003 | Liang et al. | 257/314 |
| 6,963,504 B2 * | 11/2005 | Scheuerlein et al. | 365/185.18 |
| 7,847,342 B2 | 12/2010 | Fukuzumi et al. | |
| 7,852,675 B2 | 12/2010 | Maejima | |
| 7,910,432 B2 | 3/2011 | Tanaka et al. | |
| 8,054,683 B2 | 11/2011 | Tanaka et al. | |
| 8,107,270 B2 * | 1/2012 | Scheuerlein et al. | 365/51 |
| 8,273,628 B2 | 9/2012 | Yahashi | |
| 8,692,314 B2 | 4/2014 | Lee et al. | |
| 2010/0019310 A1 | 1/2010 | Sakamoto | |
| 2010/0078701 A1 | 4/2010 | Shim et al. | |
| 2010/0159657 A1 | 6/2010 | Arai et al. | |
| 2010/0195395 A1 | 8/2010 | Jeong et al. | |

(Continued)

OTHER PUBLICATIONS

Yanagihara, Yuki, et al., "Control Gate Length, Spacing and Stacked Layer Number Design for 3D-Stackable NAND Flash Memory," 4th IEEE International Memory Workshop, May 20-23, 2012, 4 pages.

(Continued)

*Primary Examiner* — Son Dinh
(74) *Attorney, Agent, or Firm* — Vierra Magen Marcus LLP

(57) ABSTRACT

Techniques are provided for programming and reading memory cells in a 3D stacked non-volatile memory device by compensating for variations in a memory hole diameter. The memory hole diameter is smaller at the bottom of the stack, resulting in more severe read disturb. To compensate, programming of memory cells at the lower word line layers is modified. In one approach, threshold voltage (Vth) distributions of one or more data states are narrowed during programming so that a lower read pass voltage can be used in a subsequent sensing operation. A sufficient spacing is maintained between the read pass voltage and the upper tail of the highest data state. The Vth distributions can be downshifted as well. In another approach, the read pass voltage is not lowered, but the lowest programmed state is upshifted to provide spacing from the upper tail of the erased state.

22 Claims, 23 Drawing Sheets

(56) References Cited

U.S. PATENT DOCUMENTS

| | | |
|---|---|---|
| 2011/0127597 A1 | 6/2011 | Fukuzumi et al. |
| 2011/0151667 A1 | 6/2011 | Hwang et al. |
| 2011/0199833 A1 | 8/2011 | Shim et al. |
| 2012/0091521 A1 | 4/2012 | Goda |
| 2012/0300561 A1 | 11/2012 | Yun et al. |
| 2013/0016561 A1 | 1/2013 | Nam |
| 2013/0083601 A1 | 4/2013 | Liu et al. |
| 2013/0193395 A1 | 8/2013 | Lee |
| 2013/0309849 A1 | 11/2013 | Jung et al. |
| 2014/0063936 A1 | 3/2014 | Shim et al. |

OTHER PUBLICATIONS

Kim, Jiyoung, et al., "A stacked memory device on logic 3D technology for ultra-high-density data storage," Nanotechnology 22, May 16, 2011, 8 pages.

Aochi, Hideaki, BiCS Flash as a Future 3D Non-volatile Memory Technology for Ultra High Density Storage Devices, IEEE International Memory Workshop, May 2009, 2 pages.

Hsiao, Yi-Hsuan, et al., "A Critical Examination of 3D Stackable NAND Flash Memory Architectures by Simulation Study of the Scaling Capability," IEEE International Memory Workshop, May 2010, 4 pages.

Ishiduki, Megumi, et al., "Optimal Device Structure for Pipe-shaped BiCS Flash Memory for Ultra High Density Storage Device with Excellent Performance and Reliability," IEEE International Electron Devices Meeting, Dec. 2009, 4 pages.

Katsumata, Ryota, et al., "Pipe-shaped BiCS Flash Memory with 16 Stacked Layers and Multi-Level-Cell Operation for Ultra High Density Storage Devices," Symposium on VLSI Technology Digest of Technical Papers, Jun. 2009, pp. 136-137.

Nitayama, Akihiro, et al., "Bit Cost Scalable (BiCS) Flash Technology for Future Ultra High Density Storage Devices," International Symposium on VLSI Technology Systems and Applications (VLSI-TSA), Apr. 2010, 2 pages.

U.S. Appl. No. 13/910,388, filed Jun. 5, 2013.

International Search Report & The Written Opinion of the International Searching Authority dated Sep. 16, 2014, International Application No. PCT/US2014/040775.

Non-final Office Action dated Sep. 18, 2014, U.S. Appl. No. 14/279,405, filed May 16, 2014.

Restricion Requirement dated Jul. 9, 2014, U.S. Appl. No. 14/279,405, filed May 16, 2014.

Response to Restriction Requirement dated Jul. 29, 2014, U.S. Appl. No. 14/279,405, filed May 16, 2014.

International Search Report & The Written Opinion of the International Searching Authority dated Aug. 29, 2014, International Application No. PCT/US2014/040774.

U.S. Appl. No. 14/279,405, filed May 16, 2014.

Non-final Office Action dated Dec. 10, 2014, U.S. Appl. No. 13/910,388, filed Jun. 5, 2013.

Response to Office Action dated Dec. 18, 2014, U.S. Appl. No. 14/279,405, filed May 16, 2014.

* cited by examiner

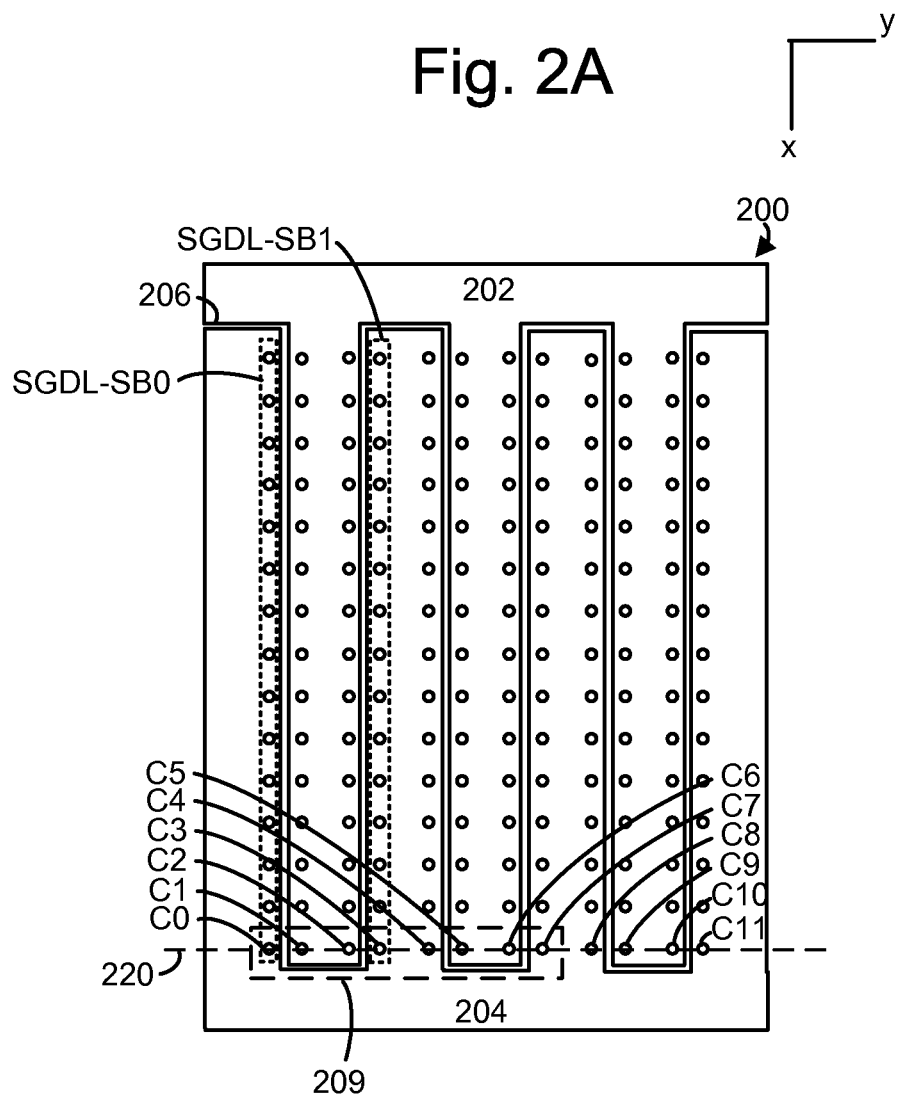

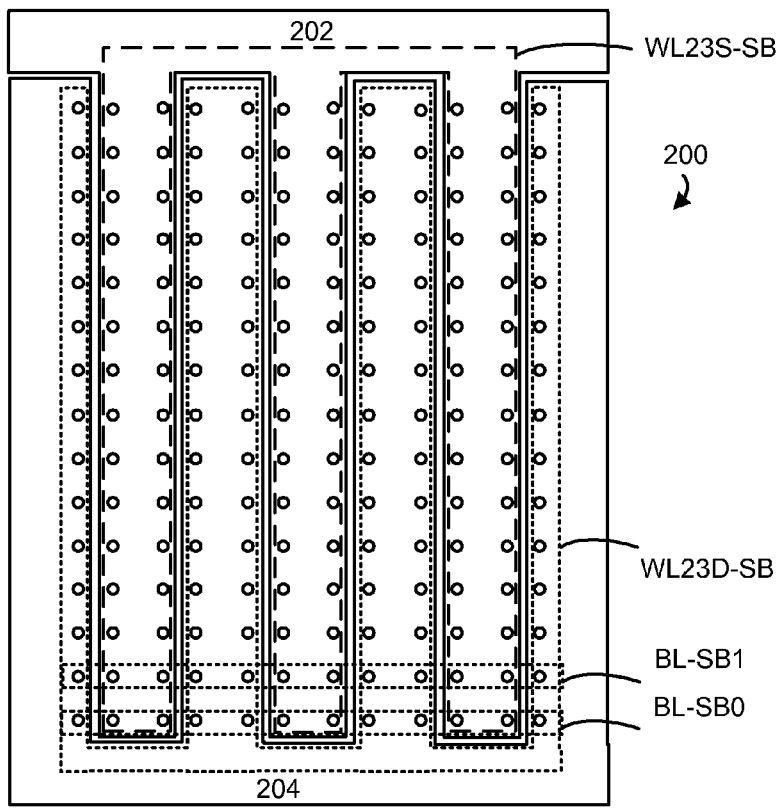
Fig. 2B1
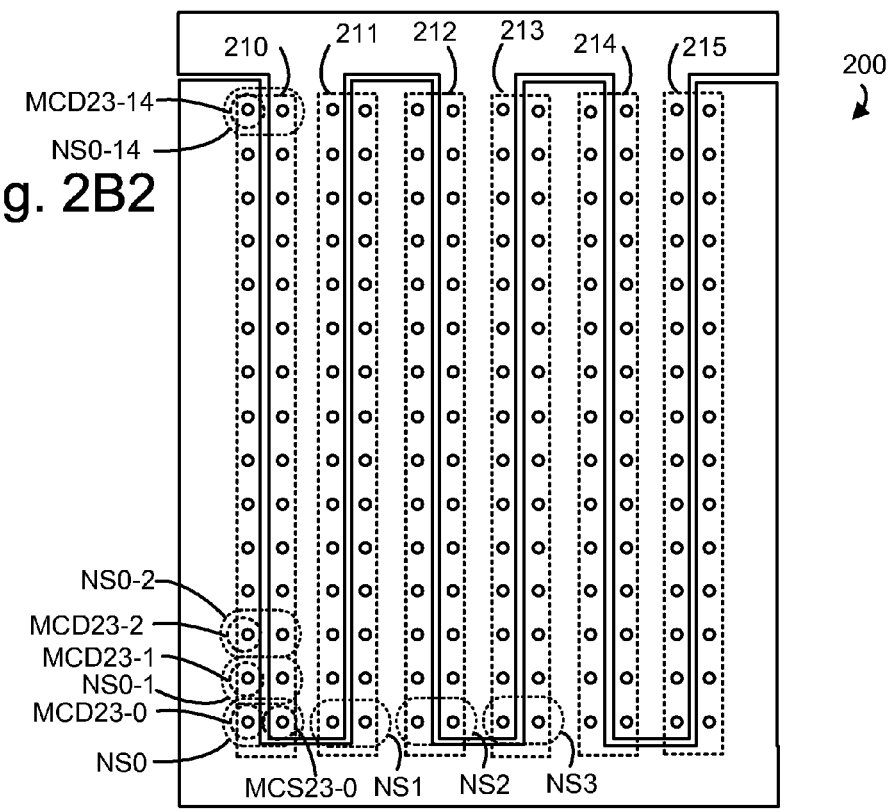
Fig. 2B2

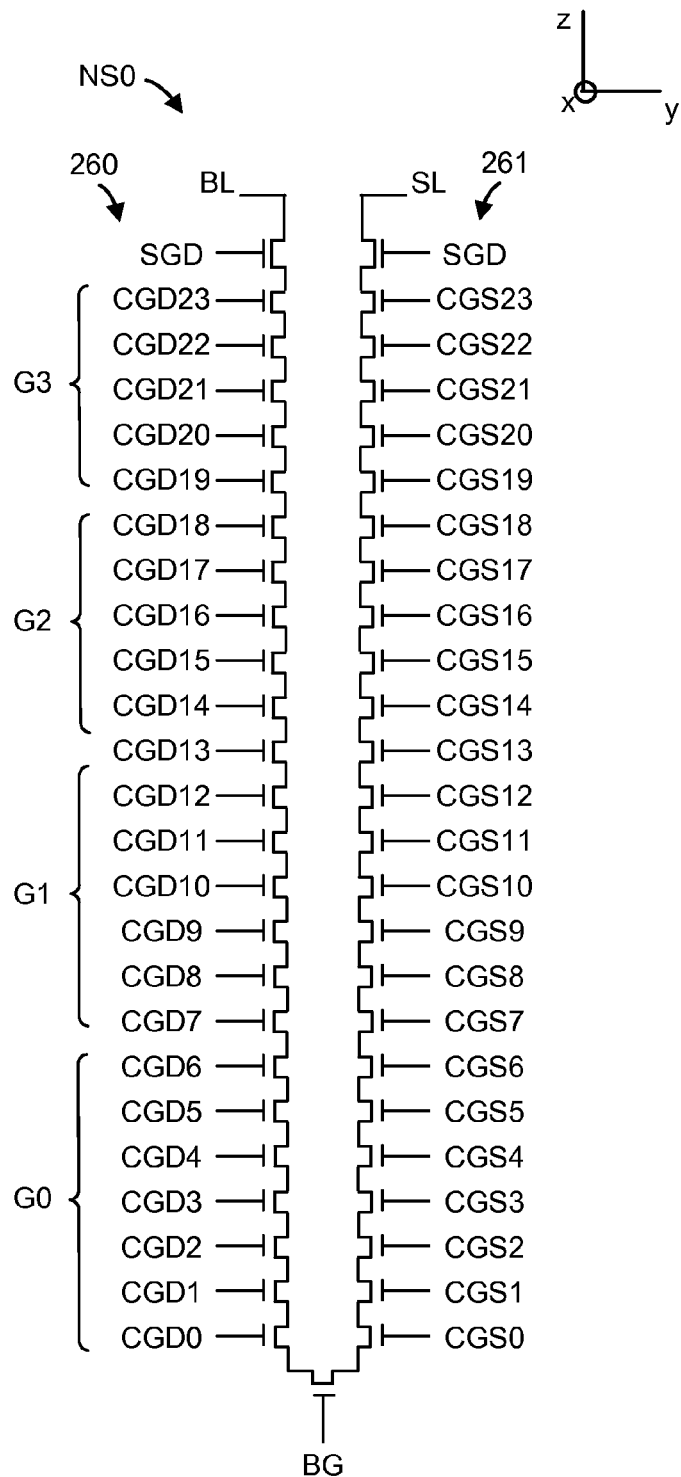
Fig. 2B3

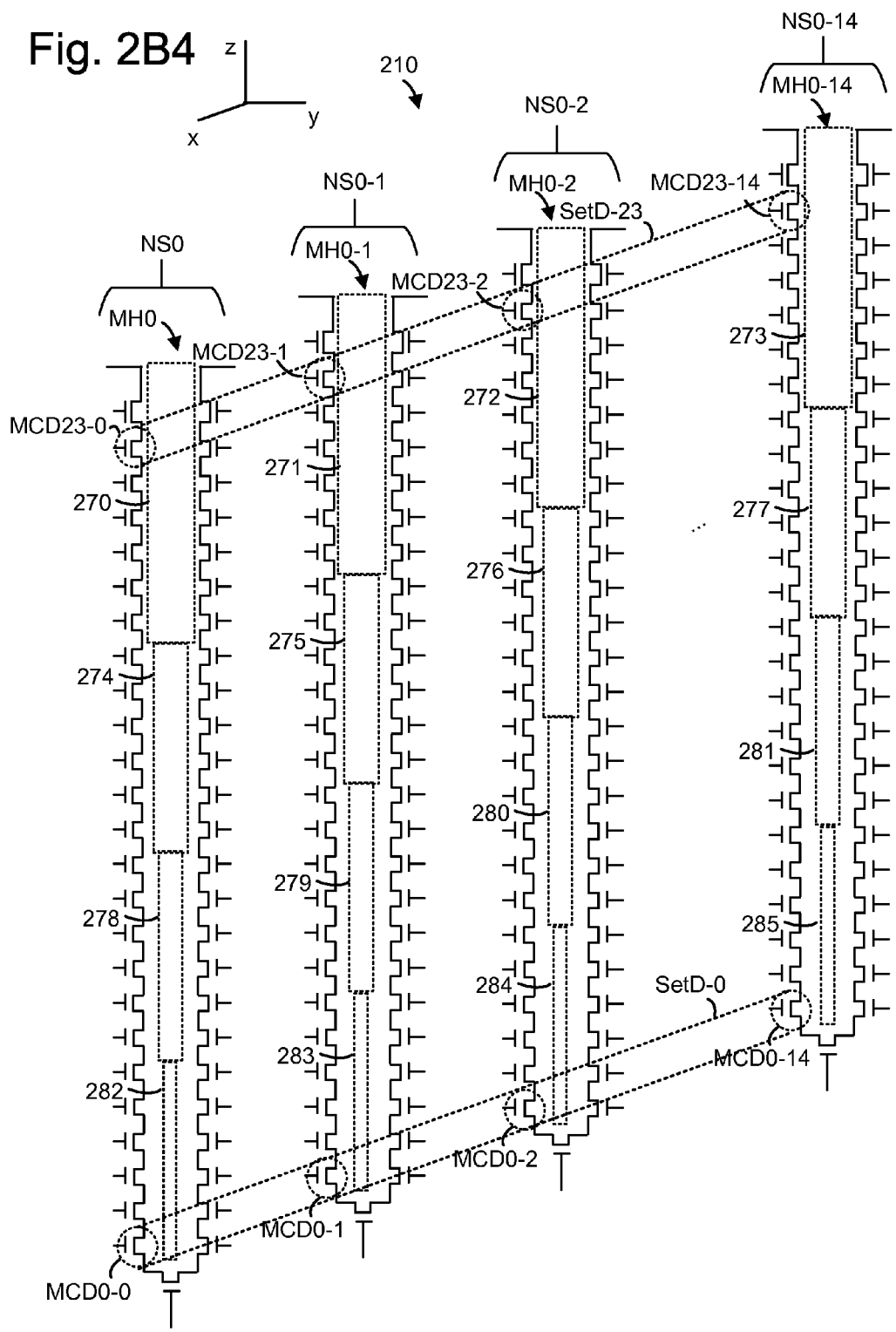

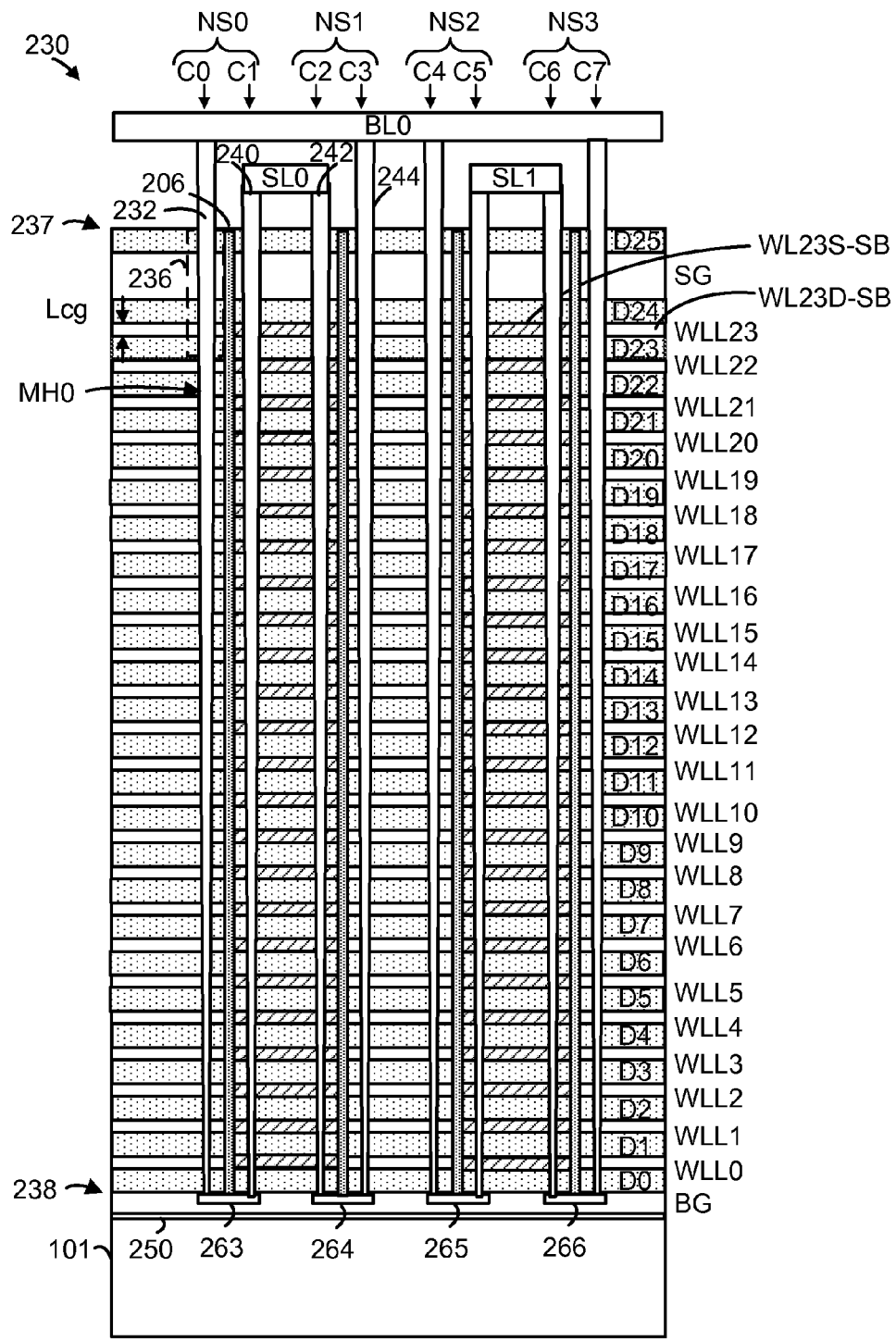

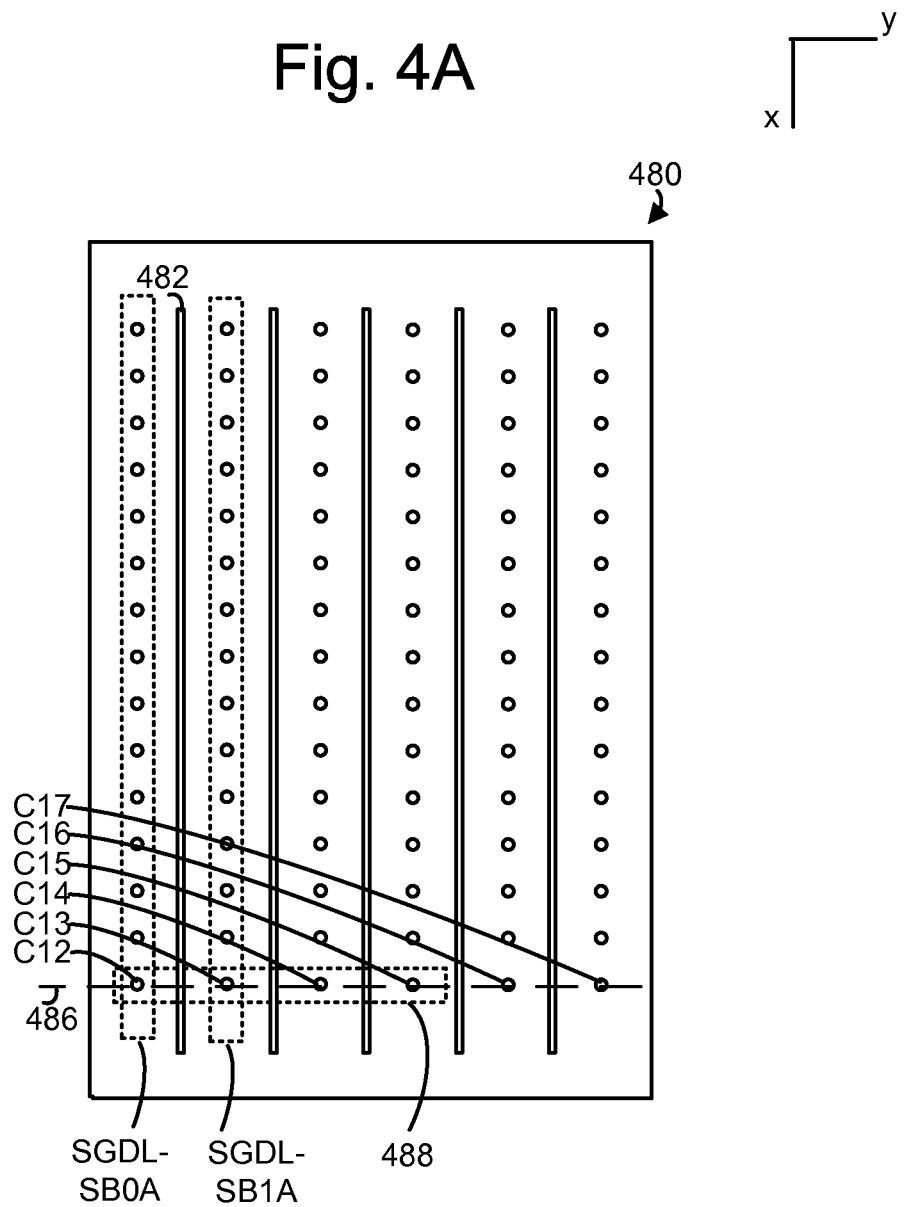

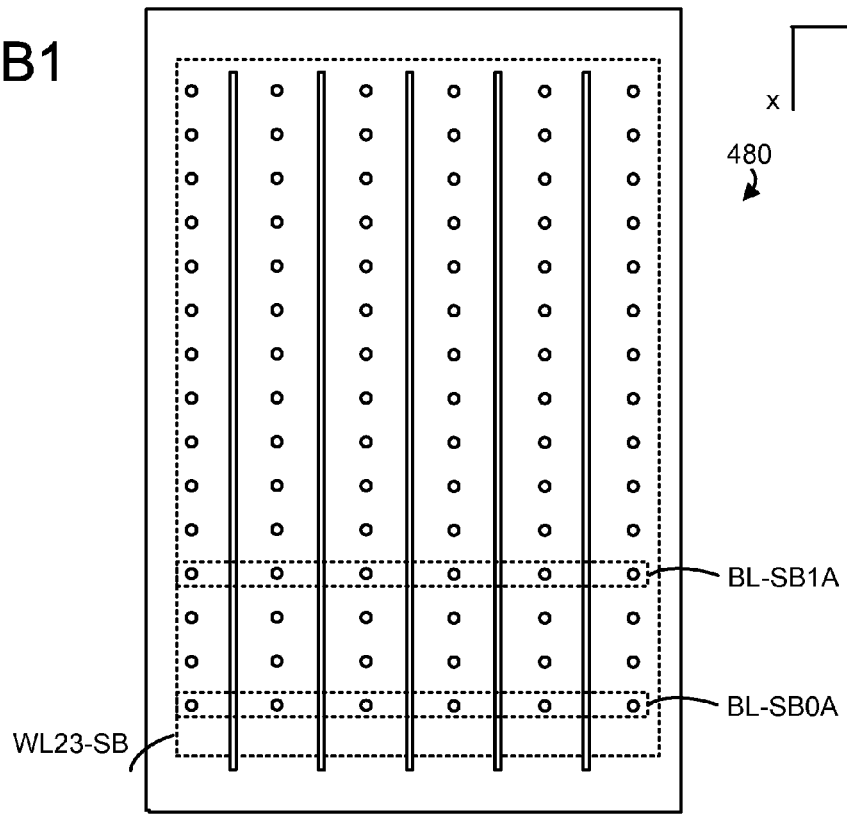
Fig. 4B1
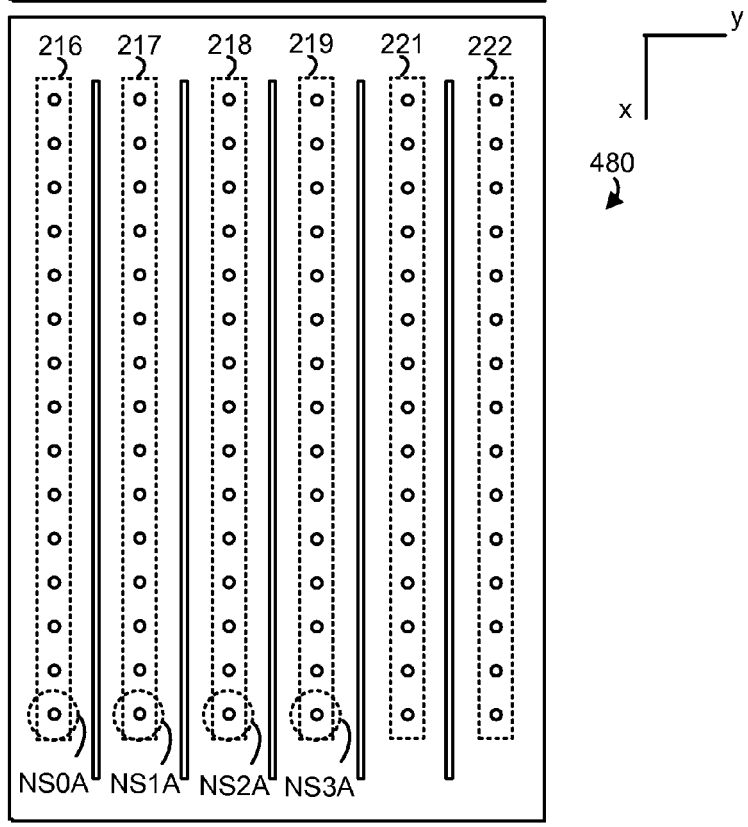
Fig. 4B2

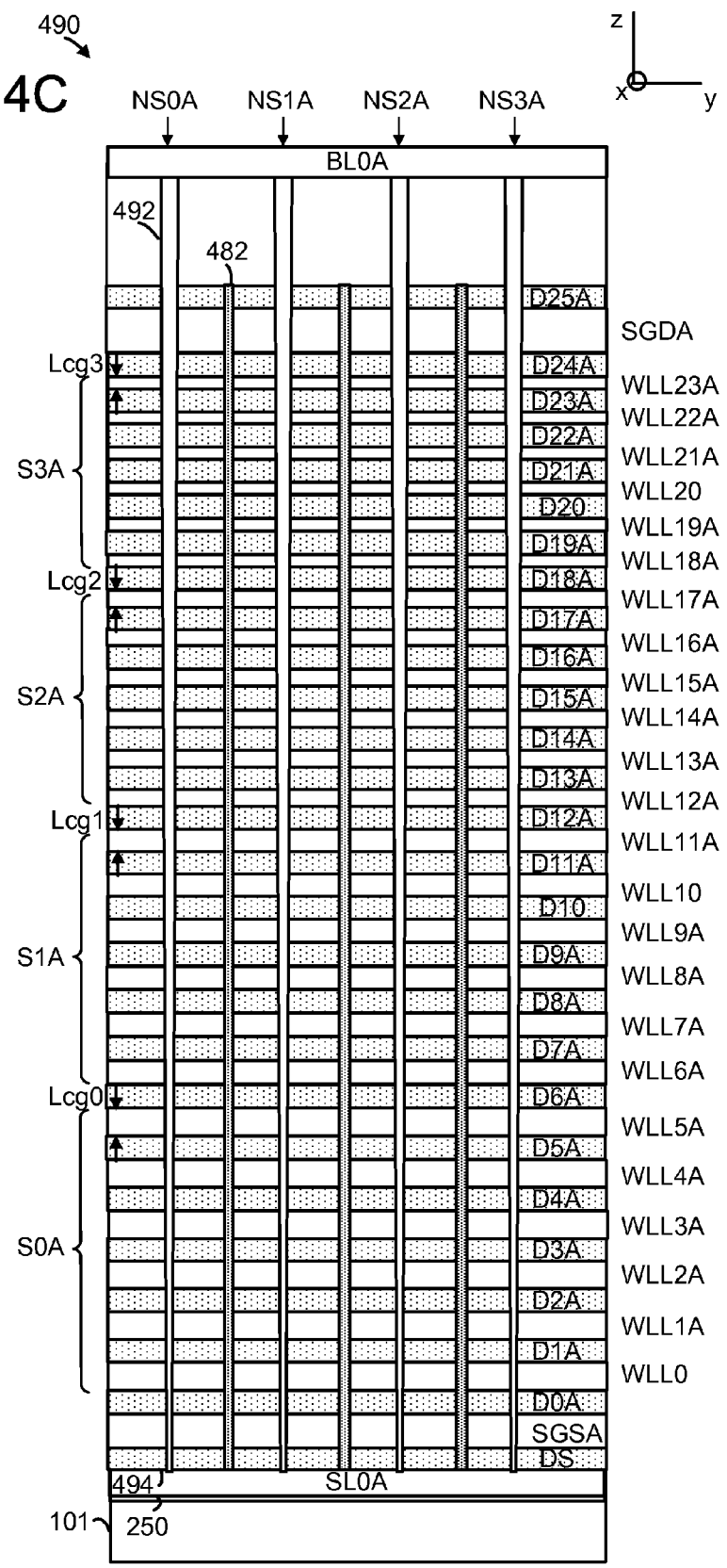

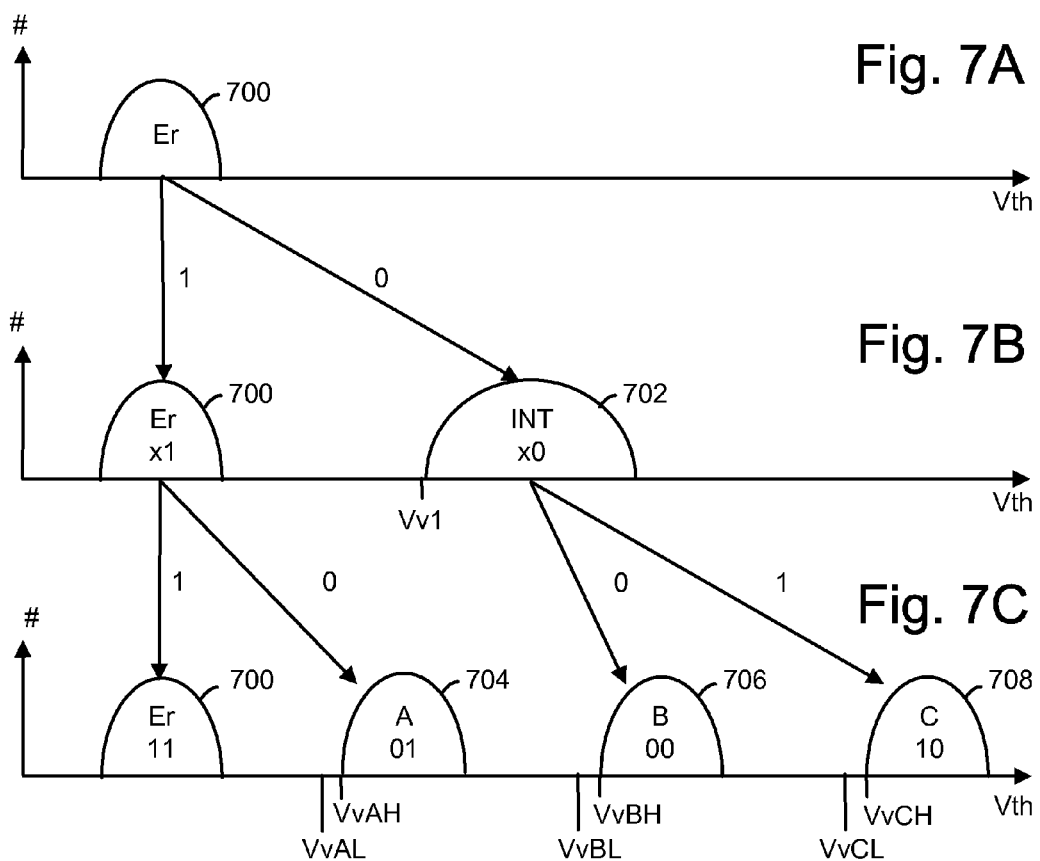

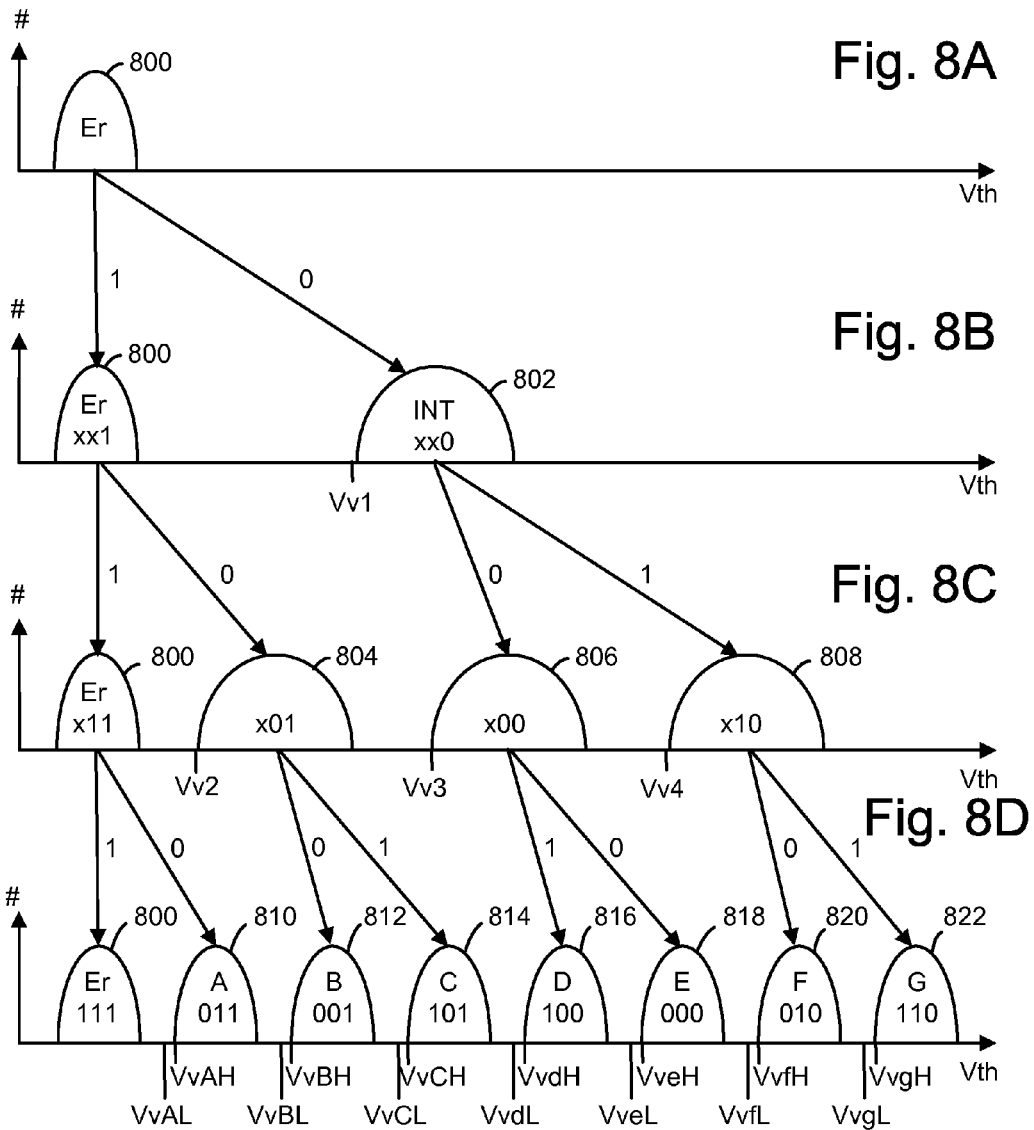

PROGRAM AND READ OPERATIONS FOR 3D NON-VOLATILE MEMORY BASED ON MEMORY HOLE DIAMETER

BACKGROUND OF THE INVENTION

1. Field of the Invention

The present invention relates to techniques for programming and reading memory cells in a 3D non-volatile memory device.

2. Description of the Related Art

Recently, ultra high density storage devices have been proposed using a 3D stacked memory structure sometimes referred to as a Bit Cost Scalable (BiCS) architecture. For example, a 3D NAND stacked memory device can be formed from an array of alternating conductive and dielectric layers. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

BRIEF DESCRIPTION OF THE DRAWINGS

Like-numbered elements refer to common components in the different figures.

FIG. 2A depicts a top view of a U-shaped NAND embodiment of a block 200, showing example SGD line subsets SGDL-SB0 and SGDL-SB1, as an example implementation of BLK0 in FIG. 1A.

FIG. 2B1 depicts the block 200 FIG. 2A, showing example word line subsets WL23D-SB and WL23S-SB and example bit line subsets BL-SB0 and BL-SB1.

FIG. 2B2 depicts the block 200 FIG. 2A, showing example sets of NAND strings 210-215.

FIG. 2B3 depicts the example NAND string NS0 of FIG. 2B2.

FIG. 2B4 depicts the example NAND strings NS0, NS0-1, NS0-2, . . . , NS0-14 of FIG. 2B2.

FIG. 2C depicts an embodiment of a stack 230 showing a cross-sectional view of the portion 209 of the block 200 of FIG. 2A, along line 220, where word line layers have a uniform thickness and the memory holes have another uniform thickness.

FIG. 4A depicts a top view of a straight NAND string embodiment (block 480) of the block BLK0 of FIG. 1A, showing example SGD line subsets SGDL-SB0A and SGDL-SB1A and example bit line subsets.

FIG. 4B1 depicts the block BLK0 of FIG. 4A, showing an example WL line subset WL23-SB and example bit line subsets BL-SB0A and BL-SB1A.

FIG. 4B2 depicts the block BLK0 of FIG. 4A, showing example sets of NAND strings 216-219, 221 and 222.

FIG. 4C depicts a cross-sectional view of the portion 488 of the block 480 of FIG. 4A along line 486, where word line layers have progressively larger thicknesses as the memory holes become progressively narrower.

FIGS. 7A to 7C depict a two pass programming operation with four data states.

FIGS. 8A to 8D depict a three pass programming operation with eight data states.

DETAILED DESCRIPTION

Figure 1A:
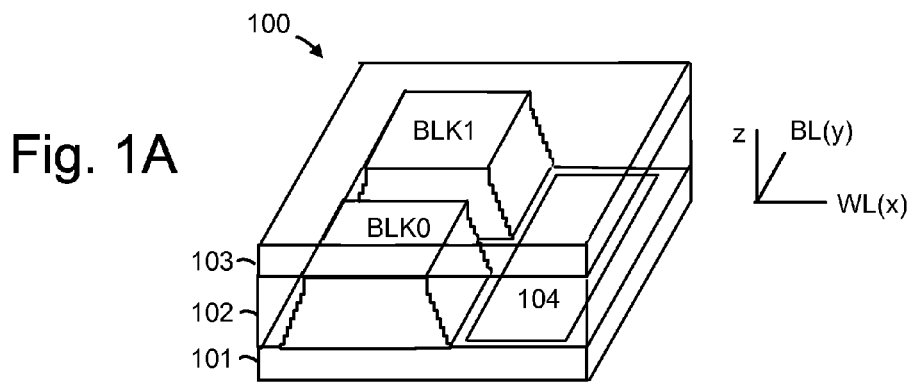
FIG. 1A is a perspective view of a 3D stacked non-volatile memory device.

Techniques are provided for programming and reading memory cells in a 3D stacked non-volatile memory device by compensating for variations in a memory hole diameter.

In such a memory device, memory hole etching is challenging due to the very high aspect ratio. For example, a depth-to-diameter ratio of about 25-30 is common. The memory hole diameter can vary along the length of the hole. Typically, the diameter becomes progressively smaller from the top to the bottom of the memory hole. In some case, a slight narrowing occurs at the top of the hole near the select gate so that the diameter becomes slight wider before becoming progressively smaller from the top to the bottom of the memory hole.

Due to the non-uniformity in the diameter of the memory hole, the programming and erase speed of the memory cells can vary based on their position along the memory hole. With a smaller diameter memory hole, the electric field across the tunnel oxide is stronger, so that the programming and erase speed is higher. Another result is that read disturb is more severe, reducing the reliability of the memory device. During a sensing operation (e.g., a read or verify operation), a moderately high read pass voltage is applied to unselected memory cells to provide them in a conductive state. The read pass voltage has to be sufficiently higher than the upper tail of the threshold voltage (Vth) distribution of the highest data state to ensure that the unselected memory cells are provided in a conductive state. With the unselected memory cells in a non-conductive state, they do not interfere with the sensing of the selected memory cells.

However, the electric field created by the read pass voltage acts as a weak programming voltage. The memory cells in the erased state are most affected by the electric field because they have the lowest Vth. As a result, the upper tail of the erased state Vth distribution of the unselected memory cells can increase and thereby decrease a read pass window. Moreover, this increase is more severe when the read pass voltage is higher. The increase is also more severe for memory cells which are read repeatedly without being erased and re-programmed. For instance, memory cells in a solid state memory of a computer may store an operating system file that is read many times. Or, memory cells may store an image or video that is accessed many times. When these memory cells are read, some of the erased state cells cannot be distinguished from some of the A-state cells, resulting in a read error. This problem becomes worse over time as more electrons are trapped in the charge trapping layer due to program-erase cycles.

One solution is to adjust the programming of a memory cell according to its position in the stack, e.g., based on the width of the adjacent portion of the memory hole. In particular, one or more of the data states can be programmed to a narrower Vth distribution, so that a lower read pass voltage can be used in a subsequent sensing operation. Advantages of this solution include reducing the read disturb. In one approach, the Vth distribution of the highest data state is narrowed but not downshifted. In another approach, the Vth distribution of the highest data state is not narrowed but is downshifted, and the Vth distribution of one or more lower data states is narrowed. In another option, the read pass voltage is not lowered in a subsequent sensing operation, but the A-state (and optionally the B-state) is upshifted during programming to provide spacing from the upper tail of the erased state. This approach accommodates rather than reduces read disturb.

Another solution is to modify the construction of the memory device so that the word line layers are thicker at portions of the memory hole which are narrower. For example, the lower word line layers can be thicker while the upper word line layers are thinner. The thickness of a word line layer defines the length of the control gate of a memory cell. In the memory hole, the read pass voltage causes an electromagnetic field across the tunnel oxide which is stronger when the memory hole is narrower. This results in increased program noise, resulting in a wider Vth distributions of the data states. A memory cell with a longer control gate will have a higher capacitance which will counteract this effect, resulting in narrower Vth distribution for each programmed data state. The data states can then be positioned optimally to reduce or accommodate read disturb.

The following discussion provides details of the construction of a memory device and of related programming and sensing techniques which address the above-mentioned issues and reduce read disturb.

FIG. 1A is a perspective view of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
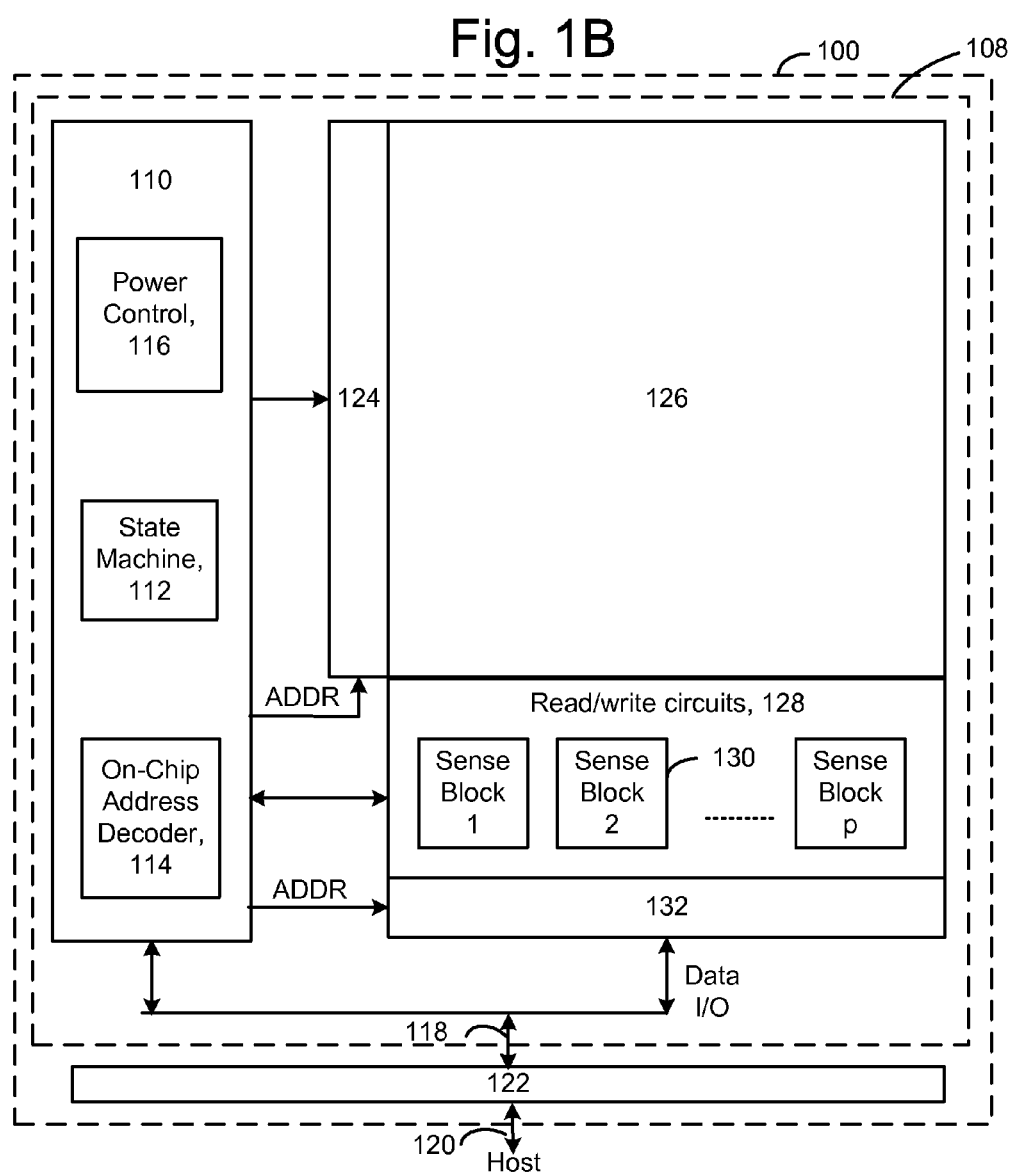
FIG. 1B is a functional block diagram of the 3D stacked non-volatile memory device 100 of FIG. 1A.

FIG. 1B is a functional block diagram of the 3D stacked non-volatile memory device 100 of FIG. 1A. The memory device 100 may include one or more memory die 108. The memory die 108 includes a 3D (three-dimensional) memory array 126 of memory cells, e.g., including the blocks BLK0 and BLK1, control circuitry 110, and read/write circuits 128. The memory array 126 is addressable by word lines via a row decoder 124 and by bit lines via a column decoder 132. The read/write circuits 128 include multiple sense blocks 130 (sensing circuitry) and allow a page of memory cells to be read or programmed in parallel. Typically a controller 122 is included in the same memory device 100 (e.g., a removable storage card) as the one or more memory die 108. Commands and data are transferred between the host and controller 122 via lines 120 and between the controller and the one or more memory die 108 via lines 118.

The control circuitry 110 cooperates with the read/write circuits 128 to perform memory operations on the memory array 126, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers and word line layer portions, drain- and source-side select gate drivers (referring, e.g., to drain- and source-sides or ends of a string of memory cells such as a NAND string, for instance) and source lines. The sense blocks 130 can include bit line drivers, in one approach.

In some implementations, some of the components can be combined. In various designs, one or more of the components (alone or in combination), other than memory array 126, can be thought of as at least one control circuit. For example, a control circuit may include any one of, or a combination of, control circuitry 110, state machine 112, decoders 114/132, power control module 116, sense blocks 130, read/write circuits 128, and controller 122, and so forth.

In another embodiment, a non-volatile memory system uses dual row/column decoders and read/write circuits. Access to the memory array 126 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the memory array 126. In this way, the density of the read/write modules is reduced by one half.

Other types of non-volatile memory in addition to NAND flash memory can also be used.

Figure 2D:
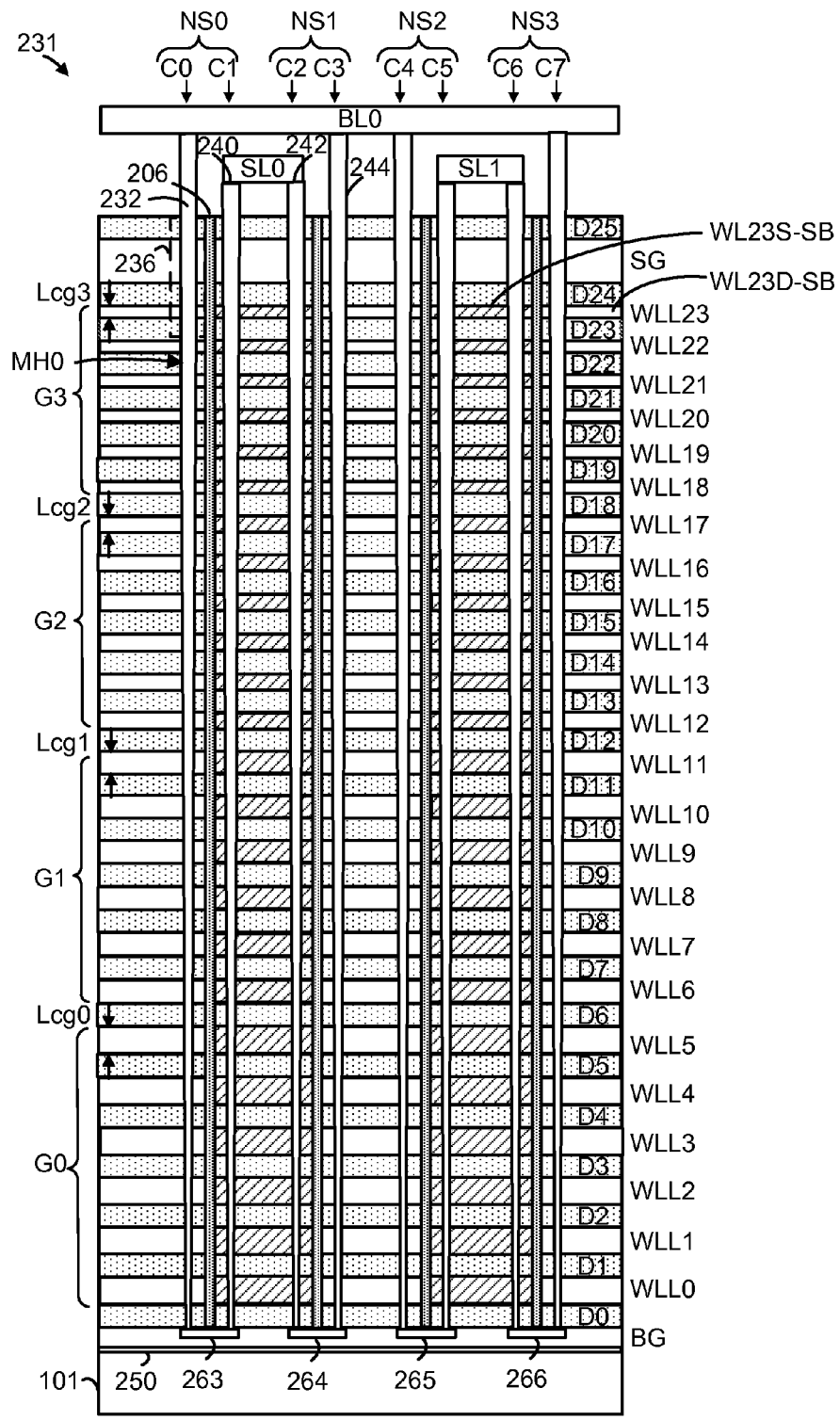
FIG. 2D depicts an embodiment of a stack 231 showing a cross-sectional view of the portion 210 of the block 200 of FIG. 2A, along line 220, where word line layers have progressively larger thicknesses as the memory holes become progressively narrower.

FIG. 2A depicts a top view of a U-shaped NAND embodiment of a block 200, showing example SGD line subsets SGDL-SB0 and SGDL-SB1, as an example implementation of BLK0 in FIG. 1A. The view is of a representative layer among the multiple word line layers in a stack. Referring also to FIGS. 2C and 2D, the stack includes alternating dielectric and conductive layers. The dielectric layers include D0 to D25 and may be made of SiO2, for instance. The conductive layers include BG, which is a back gate layer, WLL0 to WLL23, which are word line layers, e.g., conductive paths to control gates of the memory cells at the layer, and SG, which is a select gate layer, e.g., a conductive path to control gates of select gate transistors of NAND strings. The word line layer (WLL) of FIG. 2A may represent any one of WLL0 to WLL23, for instance, in an example with twenty-four word line layers. The conductive layers may include doped polysilicon or metal silicide, for instance. An example voltage of 5-10 V may be applied to the back gate to maintain a conductive state which connects the drain- and source-side columns.

For each block, the word line layer is divided into two word line layer portions 202 and 204. Each block includes a slit pattern. A slit is a void which extends vertically in the stack, typically from an etch stop layer at the bottom to at least a top layer of the stack. The slit can be filled with insulation to insulate words line layer portions from one another. A slit 206 is a single continuous slit which extends in a zig-zag pattern in the block so that the block is divided into two portions, 202 and 204, which are insulated from one another. This approach can provide greater flexibility in controlling the memory cells since the word line layer portions can be driven independently.

Each block includes rows of columnar, e.g., vertical, memory holes or pillars, represented by circles. Each row represents a vertical group of columns in the figure. The memory holes extend vertically in the stack and include memory cells such as in a vertical NAND string. Example columns of memory cells along a line 220 include C0 to C11. The figure represents a simplification, as many more rows of memory holes will typically be used, extending to the right and left in the figure. Also, the figures are not necessarily to scale. The columns of memory cells can be arranged in subsets such as sub-blocks.

Subsets of memory cells can be of different types, such as WL subsets, SGD line subsets and BL subsets.

A portion 209 of the block is depicted in further detail in connection with FIGS. 2C and 2D.

FIG. 2B1 depicts the block 200 FIG. 2A, showing example word line subsets WL23D-SB and WL23S-SB and example bit line subsets BL-SB0 and BL-SB1. This example assumes that the WLL23 layer is depicted. WLL23S-SB is a word line layer portion in communication with one (e.g., exactly one) memory cell in the source-side of each U-shaped NAND string, and WLL23D-SB is a word line layer portion in communication with one (e.g., exactly one) memory cell in the drain-side of each U-shaped NAND string.

When U-shaped NAND strings are used, each SGD line subset can include two adjacent rows of columns of memory cells. In a subset, the adjacent rows are separated by the slit. The columns of memory cells on one side of the slit are drain-side columns (e.g., C0, C3, C4 and C7 in FIG. 2C or 2D) of NAND strings, and the columns of memory cells on the other side of the slit are source-side columns (e.g., C1, C2, C5 and C6 in FIG. 2C or 2D) of the NAND strings. Note that the pattern of two source-side columns between two drain-side columns repeats in the y-direction.

Word line drivers can independently provide signals such as voltage waveforms to the word line layer portions 202 and 204.

The drawings are not to scale and do not show all memory columns. For example, a more realistic block might have 12 memory columns in the y direction as shown, but a very large number such as 32k memory columns in the x direction, for a total of 384k memory columns in a block. With U-shaped NAND strings, 192k NAND strings are provided in this example. With straight NAND strings, 384k NAND strings are provided in this example. Assume there are four memory cells per column, so there are 384k×4=1,536k or 1,536,000 total memory cells in the set.

A set of NAND strings 210 of the block 200 is described further below in connection with FIG. 2B4. This represents a set of NAND strings which have SGD transistors controlled by a common SGD line. In one approach, this also represents a unit of memory cells which are programmed. Additional sets of NAND strings 211-215 are also depicted.

FIG. 2B2 depicts the block 200 FIG. 2A, showing example sets of NAND strings 210-215. The set of NAND strings 210 includes an example NAND string NS0, such as depicted in FIG. 2B3 and example memory cells MCD23-0, MCD23-1, MCD23-2, . . . , MCD23-14, as depicted in FIG. 2B4. In this notation, "MC" denotes a memory cell, "D" denotes a drain side of the NAND strings, and the number (0, 1, 2, . . . , 14) denotes a number of the NAND string based on its position in the stack. NAND strings NS1, NS2 and NS3 are also depicted (see, e.g., FIG. 2B).

FIG. 2B3 depicts the example NAND string NS0 of FIG. 2B2. The example NAND string has a drain side 260 which extends between a bit line (BL) and a back gate (BG), and a source side 261 which extends between a source line (SL) and the BG. The drain side includes a SGD transistor and memory cells represented by control gates CGD0-CGD23. The source side includes a SGS transistor and memory cells represented by control gates CGS0-CGS23. Optionally, one or more dummy transistors on each side can be provided.

In this example, the memory cells are assigned to groups G0-G3. Each group encompasses portions of the memory hole having a similar diameter. In this case, programming and sensing operations can be customized for each group. See also FIG. 10D, which shows the use of a separate read pass voltage (Vrp) for each group during sensing operations. Each group includes memory cells on the drain and source sides. In one approach, the groups have an equal number of memory cells. In another approach, the groups have an unequal number of memory cells. Two or more groups can be used. A group may encompass all of the memory cells within a set of NAND strings in a range of word line layer portions. For example, in the set of NAND strings 210, G0, G1, G2 and G3 can encompass the memory cells in the range of WLL0-WLL6, WLL7-WLL12, WLL13-WLL18 and WLL19-WLL23.

FIG. 2B4 depicts the example NAND strings NS0, NS0-1, NS0-2, . . . , NS0-14 of FIG. 2B2 of the set 210. A set of memory cells SetD-23 encompasses all of the memory cells on the drain sides of the set of NAND strings at WLL23, including MCD23-0, MCD23-1, MCD23-2, . . . , MCD23-14. These memory cells are adjacent to portions of respective memory holes MH0, MH0-1, MH0-2, . . . , MH0-14, which have a relatively wide diameter and can therefore by treated similarly in programming and sensing operations. Another example set of memory cells SetD-0 encompasses all of the memory cells on the drain sides of the NAND strings at WLL0, including MCD0-0, MCD0-1, MCD0-2, . . . , MCD0-14. These memory cells are adjacent to portions of respective memory holes which have a relatively narrow diameter and can therefore by treated similarly in programming and sensing operations. Additional sets of memory cells can be defined in a set of NAND string at each of the word line layers.

For example, MH0 portions 270, 274, 278 and 282, MH0-1 portions 271, 275, 279 and 283, MH0-2 portions 272, 276, 280 and 284, and MH0-14 portions 273, 277, 281 and 285, are progressively smaller in diameter. As a simplification, the memory hole diameters (Dmh) are shown as decreasing in uniform steps. In practice, the memory hole diameters tend to increase gradually such as shown in FIG. 2F. Referring to FIG. 2B3, G0, G1, G2 and G3 represent memory cells which are adjacent to the memory hole portions 282-285, 278-281, 274-277 and 270-273, respectively.

FIG. 2C depicts an embodiment of a stack 230 showing a cross-sectional view of the portion 209 of the block 200 of FIG. 2A, along line 220, where word line layers have a uniform thickness and the memory holes have another uniform thickness. Lcg represents a control gate length for the memory cells, which is the same as the thickness or height of each word line layer. Columns of memory cells C0 to C7 are depicted in the multi-layer stack. The stack 230 includes the substrate 101, an insulating film 250 on the substrate, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 263 to 266 which connect the columns. The back gate thus connects the two columns of each U-shaped NAND string. For example, NS0 (NS=NAND string) includes columns C0 and C1 and connecting portion 263, and has a drain end 232 and a source end 240. NS1 includes columns C2 and C3 and connecting portion 264, and has a drain end 244 and a source end 242. NS2 includes columns C4 and C5 and connecting portion 265. NS3 includes columns C6 and C7 and connecting portion 266.

MH0 from FIG. 2B2, corresponding to C0, is depicted for reference. The memory hole is considered to be present in the final memory device even though the memory hole is filled in. The memory hole is shown as becoming progressively and gradually narrower from the top 237 to the bottom 238 of the stack. The memory holes are columnar and extend at least from a top word line layer (WLL23) of the plurality of word line layers to a bottom word line layer (WLL0) of the plurality of word line layers.

The source line SL0 is connected to the source ends 240 and 242 of two adjacent memory strings NS0 and NS1. SL0 is also connected to other sets of memory strings which are behind NS0 and NS1 in the x direction. Recall that additional U-shaped NAND strings in the stack 230 (e.g., NS0-1, NS0-2, . . . , NS0-14 from FIG. 2B4) extend behind the U-shaped NAND strings depicted in the cross-section, e.g., along the x-axis, in a SGD line direction. The U-shaped NAND strings NS0 to NS3 are each in a different SGD line subset, but are in a common BL subset.

The slit 206 from FIG. 2A is also depicted as an example. In the cross-section, multiple slit portions are seen, where each slit portion is between the drain- and source-side columns of a U-shaped NAND string. A portion of the bit line BL0 is also depicted.

Figure 3A:
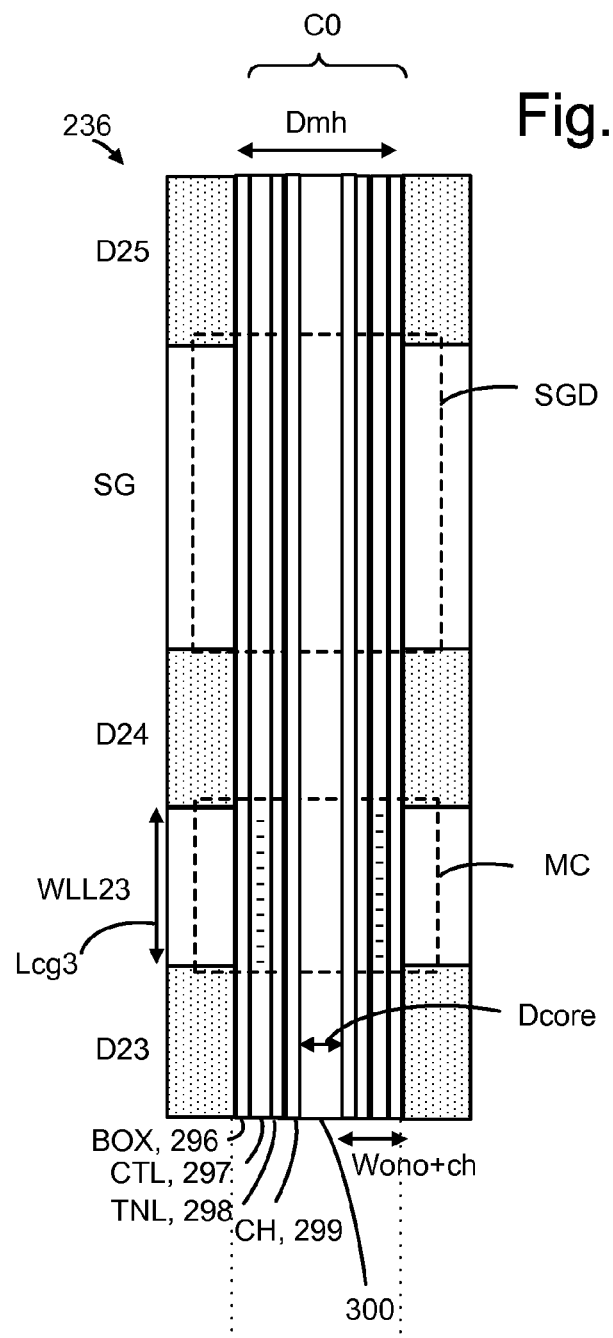
FIG. 3A depicts a close-up view of the region 236 of the column C0 of FIG. 2D, showing a drain-side select gate transistor SGD in the SG layer and a memory cell MC in word line layer WLL23.

A region 236 of the stack is shown in greater detail in FIG. 3A.

Word line layers WLL0-WLL23 and dielectric layers D0-D24 extend alternatingly in the stack. The SG layer is between D24 and D2. Each word line layer has a drain-side portion and a source-side portion. For example, WL23S-SB is a source-side sub-block of WLL23, and WL23D-SB is a drain-side sub-block of WLL23, consistent with FIG. 2B1. In each word line layer, the diagonal line patterned region represents the source-side sub-block, and the unpatterned region represents the drain-side sub-block.

FIG. 2D depicts an embodiment of a stack 231 showing a cross-sectional view of the portion 209 of the block 200 of FIG. 2A, along line 220, where word line layers have progressively larger thicknesses as the memory holes become progressively narrower. For example, using the group assignments of FIG. 2B3, the thicknesses of the word line layers in G3, G2, G1 and G0 are Lcg3, Lcg2, Lcg1 and Lcg0, respectively, where Lcg3<Lcg2<Lcg1<Lcg0 so that the word line layers are progressively larger moving from the top to the bottom of the stack. This is one example approach. Another approach is to have smaller or larger groups of word line layers which have a same thickness, and/or to have a unique thickness for one or more word line layers. Other approaches are possible as well. Having more groups allows greater customizing of the characteristics of each word line layer based on the associated memory hole diameter but may increase complexity.

Figure 2E:
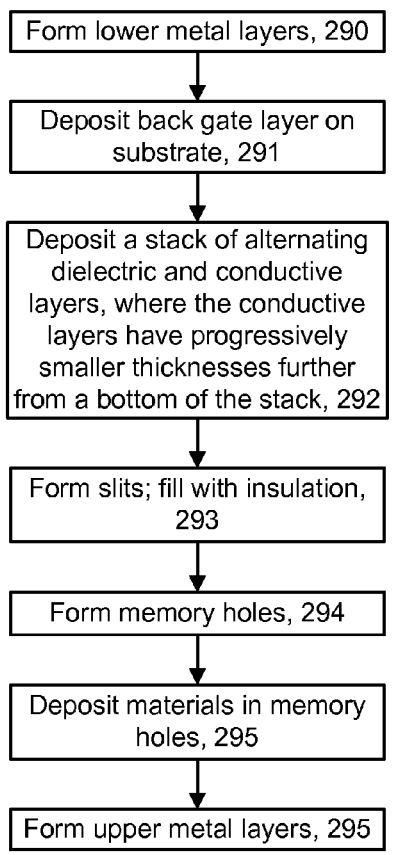
FIG. 2E depicts a process for forming a memory device in accordance with FIG. 2D.
Figure 2F:
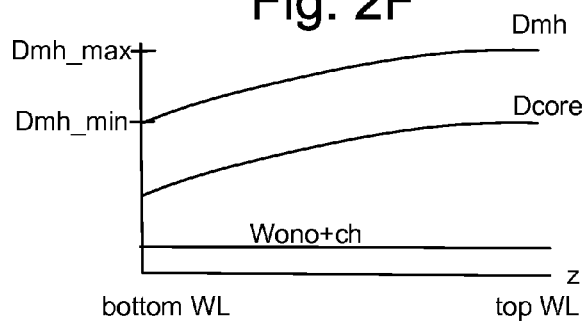
FIG. 2F depicts a variation in a memory hole diameter (Dmh) in a stack of word line layers.

FIG. 2E depicts a process for forming a memory device in accordance with FIG. 2D. The process represents a simplification. Step 290 involves forming lower metal layers such as wiring layers in the substrate of the memory device. Step 291 involves depositing a back gate layer on the substrate, in the case of a U-shaped NAND string. Step 292 involves depositing a stack of alternating dielectric and conductive layers, where the conductive layers have progressively smaller thicknesses further from a bottom of the stack. See FIGS. 2G, 2H and 2I for further details regarding the variation in the control gate length for different word line layers. For example, a thicker layer can be achieved by a longer deposition time for the word line layer material. Alternatively, the conductive layers have uniform thicknesses as shown in FIG. 2C. Step 293 involves forming slits in the stack, and filling the slits in with insulation. Step 294 involves forming the memory holes such as by etching the stack. Step 295 involves depositing materials in the memory holes. See, e.g., FIGS. 3A and 3B. Step 295 involves forming upper metal layers such as bit lines, source lines and SGD lines in an insulation region above the stack.

FIG. 2F depicts a variation in Dmh in a stack of word line layers. The x-axis represents a distance in a stack ranging from a bottom word line to a top word line. As mentioned, the diameter tends to decrease toward the bottom of the stack. Dmh ranges from a minimum diameter, Dmh_min to a maximum diameter, Dmh_max. Dmh is expected to vary consistently among different memory holes in the memory device.

As explained in connection with FIGS. 3A and 3B, Dcore is a diameter of the core region of a memory hole and tends to vary with Dmh, and Wono+ch is the sum of the widths of an ONO region and a channel region. Wono+ch tends to be uniform in a memory hole since these materials are deposited on sidewalls of the memory hole.

Figure 2G:
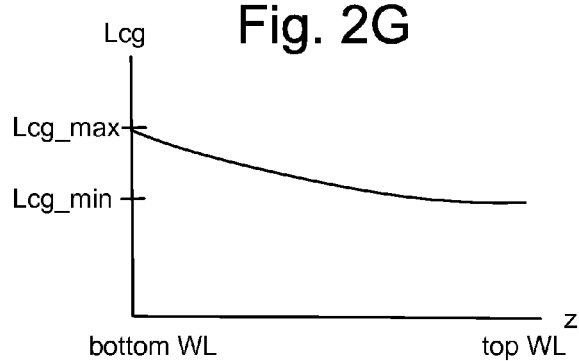
FIG. 2G depicts a gradual variation in a control gate length in a stack of word line layers in accordance with one embodiment of step 292 of FIG. 2E.

FIG. 2G depicts a gradual variation in a control gate length in a stack of word line layers in accordance with one embodiment of step 292 of FIG. 2E. As mentioned, the control gate width, which is the thickness of a word line layer, can be set as desired by adjusting the fabrication process for the stack. In this example, the fabrication process is controlled so that Lcg decreases gradually from the bottom word line to the top word line. However, the thicknesses of the word line layers can vary according to any desired pattern. For example, the thinnest word line (e.g., the bottom word line) can be about 10 to 50% thicker than the thickest word line (e.g., the top word line). Here, Lcg ranges from Lcg_max for the bottom word line to Lcg_min for the top word line. A thickest word line layer of the plurality of word line layers can be at least 10% thicker than a thinnest word line layer of the plurality of word line layers.

The thicknesses can comprise one thickness (one of Lcg0-Lcg3 in FIG. 2D) for one group (one group of G0-G3) of word line layers of a plurality of word line layers, and another thickness (another of Lcg0-Lcg3) for another group (another group of G0-G3) of word line layers of the plurality of word line layers.

Figure 2H:
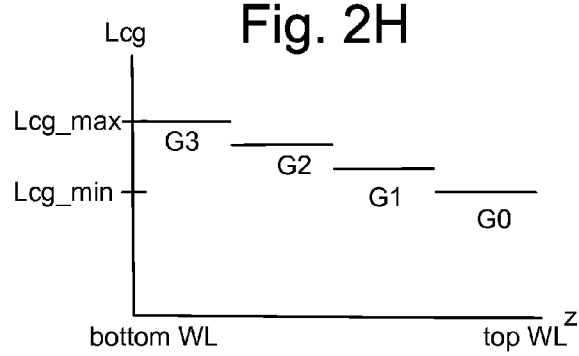
FIG. 2H depicts a step-wise variation in a control gate length in a stack of word line layers in accordance with another embodiment of step 292 of FIG. 2E.

FIG. 2H depicts a step-wise variation in a control gate length in a stack of word line layers in accordance with another embodiment of step 292 of FIG. 2E. The fabrication process can be controlled so that a uniform word line layer thickness is obtained for each group of word line layers, e.g., by using a respective deposition time for the word line layers of each group. This simplifies the fabrication process. Here, four groups are used, as discussed previously, such that the control gate length ranges from Lcg_max for G3, which encompasses the bottom word line, to Lcg_min for G0, which encompasses the top word line. Intermediate values of Lcg can be used for the intermediate groups of G1 and G2. The groups are the same or similar in size in this example.

Figure 2I:
FIG. 2I depicts another step-wise variation in a control gate length in a stack of word line layers in accordance with another embodiment of step 292 of FIG. 2E.

FIG. 2I depicts another step-wise variation in a control gate length in a stack of word line layers in accordance with another embodiment of step 292 of FIG. 2E. Two groups of different sizes are used in this example. This further simplifies the fabrication process while providing an increased Lcg for the lower word line layers which are most susceptible to read disturb. The control gate length is Lcg_min for a smaller group which encompasses the bottom word line, and Lcg_max for a larger group which encompasses the top word line. For example, the smaller group can include 10-20% of the word line layers while the larger group includes 80-90% of the word line layers.

FIG. 3A depicts a close-up view of the region 236 of the column C0 of FIG. 2D, showing a drain-side select gate transistor SGD in the SG layer and a memory cell MC in word line layer WLL23. The region also shows portions of the dielectric layers D23 to D25. Each column includes a number of layers which are deposited along the sidewalls of the column. These layers can include oxide-nitride-oxide (O-N-O) and polysilicon layers which are deposited, e.g., using atomic layer deposition. For example, a block oxide (BOX) can be deposited as layer 296, a nitride such as SiN as a charge trapping layer (CTL) can be deposited as layer 297 and a tunnel oxide (TNL) can be deposited as layer 298, to provide the O-N-O layers. Further, a polysilicon body or channel (CH) can be deposited as layer 299, and a core filler dielectric can be deposited as region 300. Additional memory cells are similarly formed throughout the columns. Dmh represents the memory hole diameter, and Dcore represents the core diameter, which can both vary along the length or longitudinal axis of the memory hole, as discussed in connection with FIG. 2F. Lcg3 represents the thickness of WLL23. This is the control gate length for each memory cell in WLL23. Wono+ch, discussed previously, is also depicted.

When a memory cell is programmed, electrons are stored in a portion of the CTL which is associated with the memory cell. For example, electrons are represented by "-" symbols in the CTL 297 for the MC. These electrons are drawn into the CTL from the channel, and through the TNL. The Vth of a memory cell is increased in proportion to the amount of stored charge. As mentioned, electrons can become trapped in the CTL as additional program-erase cycles are experienced. This makes it easier for read disturb to occur.

Each of the memory holes is filled with a plurality of annular layers comprising a block oxide layer, a charge trapping layer, a tunneling layer and a channel layer. A core region of each of the memory holes is filled with a body material, and the plurality of annular layers are between the core region and the word line layers in each of the memory holes. Further, the diameter of the memory hole (Dmh) varies along a memory hole based on a variation in the diameter of the core region (Dcore) based on the assumption that Wono+ch is fixed, where Dcore+Wono+ch=Dmh.

Figure 3B:
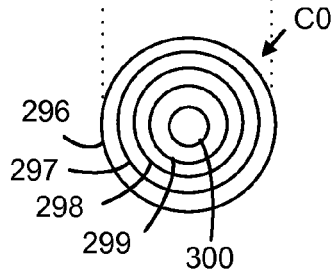
FIG. 3B depicts a cross-sectional view of the column C0 of FIG. 3A.

FIG. 3B depicts a cross-sectional view of the column C0 of FIG. 3A. Each layer is ring-shaped in one possible approach, except the core filler, which is a tapered cylinder.

FIG. 4A depicts a top view of a straight NAND string embodiment (block 480) of the block BLK0 of FIG. 1A, showing example SGD line subsets SGDL-SB0A and SGDL-SB1A. In this configuration, a NAND string has only one column, and the source-side select gate is on the bottom of the column instead of on the top, as in a U-shaped NAND string. Moreover, a given level of a block has one word line layer which is connected to each of the memory cells of the layer. For example, FIG. 4B1 depicts the block BLK0 of FIG. 4A, showing an example WL line subset WL23-SB and example bit line subsets BL-SB0A and BL-SB1A. A number of slits, such as example slit 482, can also be used. These insulation-filled slits are used in the fabrication process to provide structural support for the stack when undoped polysilicon layers are removed by a wet etch and a dielectric is deposited to form the alternating dielectric layers. A dashed line 486 extends through columns C12 to C17. A cross-sectional view along line 486 of portion 488 is shown in FIG. 4C.

FIG. 4B2 depicts the block BLK0 of FIG. 4A, showing example sets of NAND strings 216-219, 221 and 222. Example NAND strings NS0A-NS3A in the portion 488 are also depicted.

FIG. 4C depicts a cross-sectional view of the portion 488 of the block 480 of FIG. 4A along line 486, where word line layers have progressively larger thicknesses as the memory holes become progressively narrower. Columns of memory cells corresponding to NAND strings NS0A-NS3A in FIG. 4B2 are depicted in the multi-layer stack. The stack 490 includes a substrate 101, an insulating film 250 on the substrate, and a portion of a source line SL0A. Recall that the additional straight NAND strings in a SGD line subset extend in front of and in back of the NAND strings depicted in the cross-section, e.g., along the x-axis. NS0A has a source end 494 and a drain end 492. The slit 482 from FIG. 4A is also depicted with other slits. A portion of the bit line BL0A is also depicted. Dashed lines depict memory cells and select gate transistors. The techniques described herein can be used with a U-shaped or straight NAND. Word line layers WLL0-WLL23A are arranged alternatingly with dielectric layers D0A-D24A in the stack. An SGD layer, SGDA, an SGS layer, SGSA, and an additional dielectric layer DS are also depicted. SGDA is between D24A and D25A.

Figure 5A:
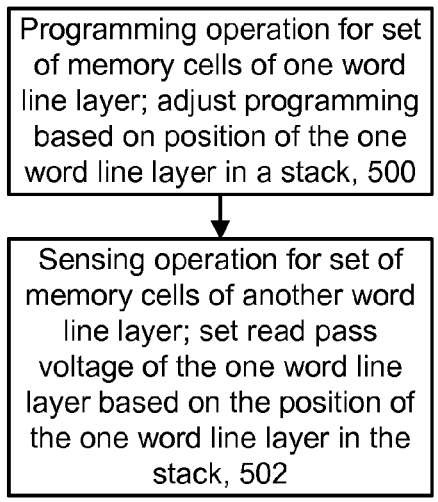
FIG. 5A depicts a process for programming and sensing memory cells according to a word line layer of the memory cells.

FIG. 5A depicts a process for programming and sensing memory cells according to a word line layer of the memory cells. A first step 500 involves a programming operation for a set of memory cells of one word line layer. SetD-23 in FIG. 2B4 is an example set of memory an example word line layer WLL23. The step adjusts the programming based on the position of the one word line layer in a stack. The position is a proxy for Dmh so that the step involves adjusting the programming based on a diameter of a portion of the memory hole which extends through in the one word line layer. The relationship between word line layer and Dmh can be established from measurements made of representative memory devices. A command to perform a programming operation can include an identifier the word line layer for the memory cells which are to store data, and this identifier can be cross-referenced to one or more programming conditions to be used. See FIG. 5B for further details.

A second step 502 involves a sensing operation for a set of memory cells of another word line layer. SetD-23 in FIG. 2B4 is an example of another set of memory cells in the example word line layer WLL0. This step includes setting a read pass voltage of the one word line layer based on the position of the one word line layer in the stack. The read pass voltage can be set for other unselected word line layers as well based on their respective positions in the stack. See FIG. 5C for further details. The sensing operation can be performed multiple times after the programming operation is performed once.

The one word line layer represents any word line layer. The programming of the memory cells of the one word line layer using programming conditions customized for that one word line layer results in a desired Vth distribution for the memory cells which, in turn, allows a read pass voltage which is customized for that one word line layer to be used on one or more occasions when subsequently sensing memory cells of another word line. During this sensing, other word line layers (in addition to the one word line layer) receive a customized read pass voltage as well. For example, if memory cells of WLL0 are being sensed, a read pass voltage is applied to each of the remaining word line layers (e.g., WLL1-WLL23).

Note that in some cases, some word line layers are not programmed so that their memory cells are all in the erased state. A common read pass voltage can be used for these word line layers.

Figure 5B:
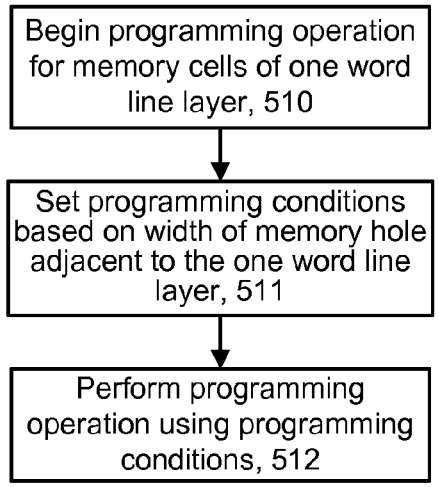
FIG. 5B depicts an example of the process for programming memory cells according to step 500 of FIG. 5A.

FIG. 5B depicts an example of the process for programming memory cells according to step 500 of FIG. 5A. Step 510 includes beginning a programming operation for memory cells of one word line layer. For example, these could be memory cells of a set of NAND strings (e.g., both source- and drain-sides, source-side only, or drain-side only). Step 511 includes setting programming conditions based on a width of the memory hole adjacent to the one word line layer (e.g., based on the word line layer position in the stack). The programming conditions can include, e.g., one or more programming pulse step sizes, a bit line voltage which is used during a programming pulse and conditions for changing the programming pulse step size or the bit line voltage partway through a programming pass. The conditions can include a fixed condition such as a predetermined number of program pulses which are applied in a programming pass, or an adaptive condition such as when programming of a certain data state has been completed. Step 512 includes performing the programming operation using the programming conditions. See FIG. 5D for further details. The steps can be repeated when other memory cells of the same word line layer are programmed, using the same programming conditions, or when memory cells of a next word line layer are programmed, using the same or different programming conditions.

Figure 5C:
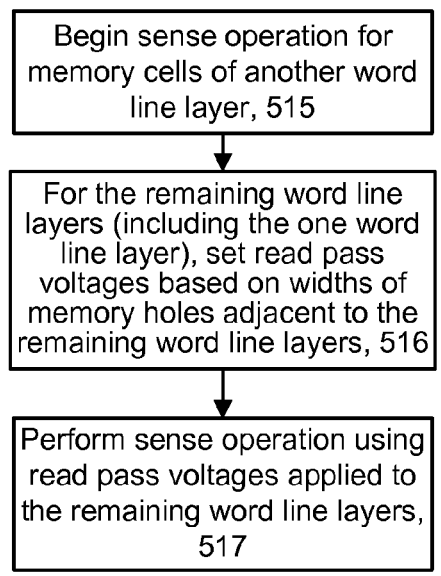
FIG. 5C depicts an example of the process for sensing memory cells according to step 502 of FIG. 5A.

FIG. 5C depicts an example of the process for sensing memory cells according to step 502 of FIG. 5A. Step 515 begins a sense operation (e.g., a verify or read operation). At step 516, for each remaining word line layer (including the one word line layer referred to in FIG. 5A or 5B), read pass voltages are set based on the widths of the memory holes adjacent to the remaining word line layers. Step 517 involves performing the sense operation using the read pass voltages applied to the remaining word line layers. The sense operation can concurrently sense the conductive or non-conductive state of a memory cell in each NAND string in a set of NAND strings. In one approach, a control gate voltage is applied to the sensed memory cells via the word line layer so that the memory cell (and the NAND string) are in a conductive state if the Vth of the memory cell is less than the control gate voltage, or the memory cell (and the NAND string) are in a non-conductive state if the Vth of the memory cell is greater than the control gate voltage. See FIG. 5E for further details.

Figure 5D:
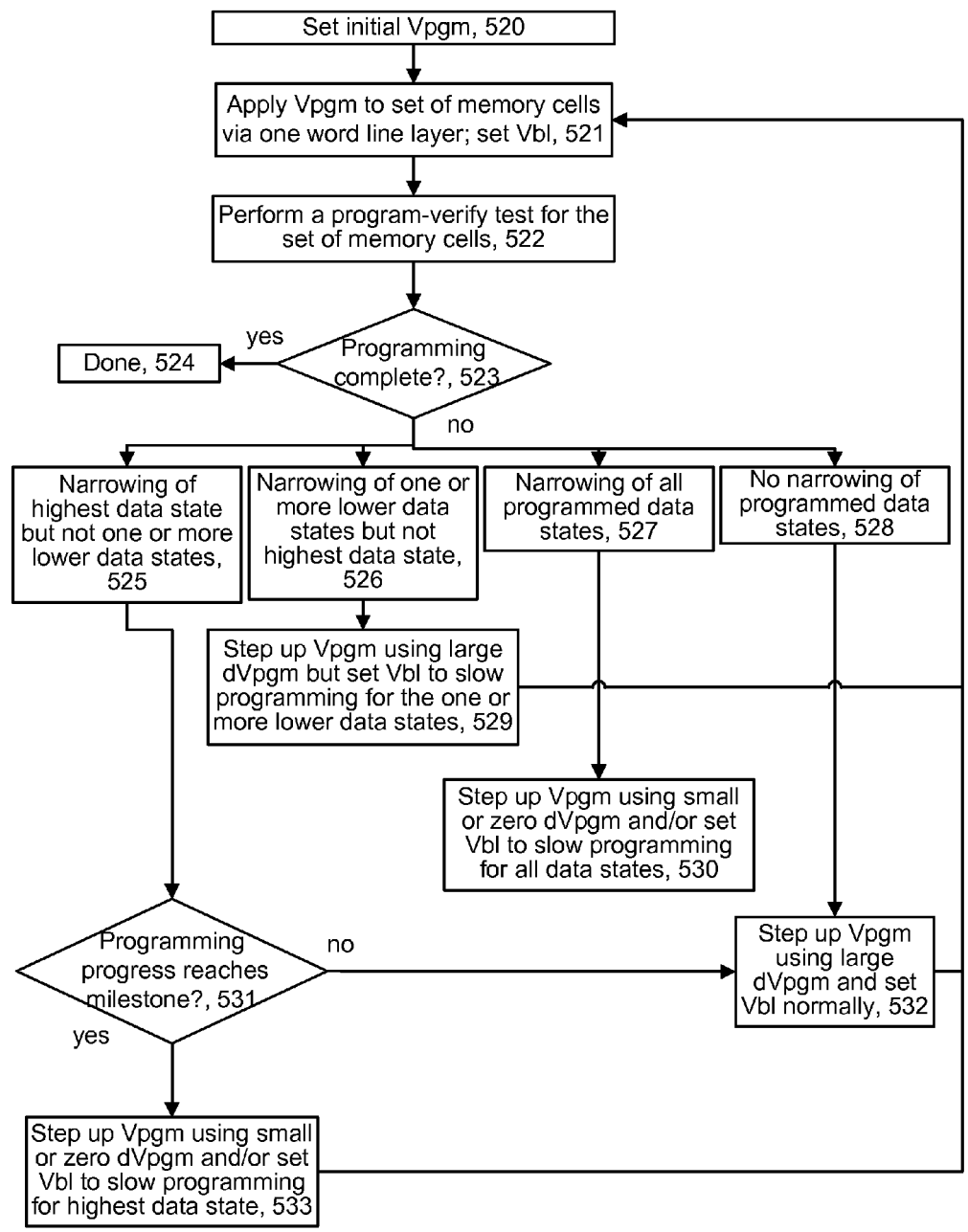
FIG. 5D depicts an example of the process for performing a programming operation according to step 512 of FIG. 5B.

FIG. 5D depicts an example of the process for performing a programming operation according to step 512 of FIG. 5B. Step 520 sets an initial Vpgm. Step 521 applies Vpgm to a set of memory cells (e.g., in a set of NAND strings) via one word line layer. A bit line voltage (Vbl) is also set to an initial level (e.g., normal, slow programming or inhibit) for each NAND string in the set of NAND strings. A normal Vbl value can be 0 V, which does not slow programming. A Vbl which slows programming may be 1 V such as in a "quick pass write" (QPW) programming technique, discussed further below. A Vbl which inhibits (stops) programming may be 2-3 V. Step 522 performs a program-verify test for the set of memory cells. At decision step 523, if the programming is complete, the process is done at step 524. If programming is not complete, one of four paths can be followed. Three of the paths provide Vth distribution narrowing based on the position of the one word line layer in the stack. The narrowing can be provided for programming of one or more data states, as discussed further in connection with FIGS. 9A-9E. Upshifting or downshifting of the Vth distributions can also be provided.

Narrowing is generally desired for memory cells which are lower in the stack, where the memory holes are narrower. A fourth path involves no narrowing, e.g., when the memory cells are higher in the stack, where the memory holes are wider. One of the four paths can be chosen based on the position of the one word line layer in the stack.

Specifically, a first path is a programming mode involving narrowing of the highest data state (e.g., C) but not of one or more lower data states (e.g., A and B) (step 525), such as depicted in FIGS. 9B and 12A-12C. A decision step 531 determines whether a programming milestone has been reached. This can occur, e.g., when programming to one of the lower data states has been completed or when a specified number of program pulses have been applied in a program pass. If the milestone is not reached, Vpgm is stepped up using a relatively large dVpgm and Vbl is set normally at step 532. A next program pulse is then applied at step 521. If the milestone is reached, Vpgm is stepped up using a relatively small or zero dVpgm, and/or by setting Vbl to slow programming for the highest data state at step 533.

A second path is a programming mode involving narrowing of one or more lower data states but not of the highest data state (step 526), such as depicted in FIGS. 9C, 9E and 13A-13C. Vpgm is stepped up using a relatively large dVpgm and Vbl is set to slow programming for the one or more lower data states at step 529. Vbl can be set to a normal level for the highest data states so that their programming is not slowed and the overall programming time is not increased.

Figure 9A:
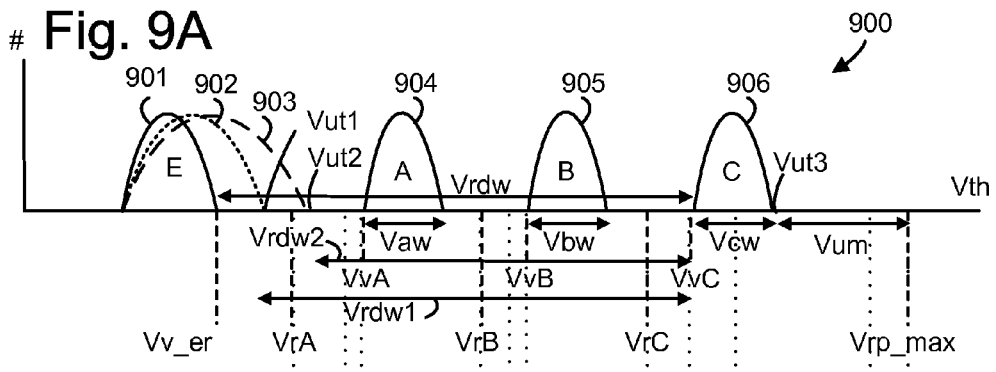
FIG. 9A depicts a threshold voltage (Vth) distribution with four data states, showing a reduction in a read window from Vrdw1 to Vrdw2 according to an increase in an upper tail of the erased state distribution from Vut1 to Vut2.
Figure 9B:
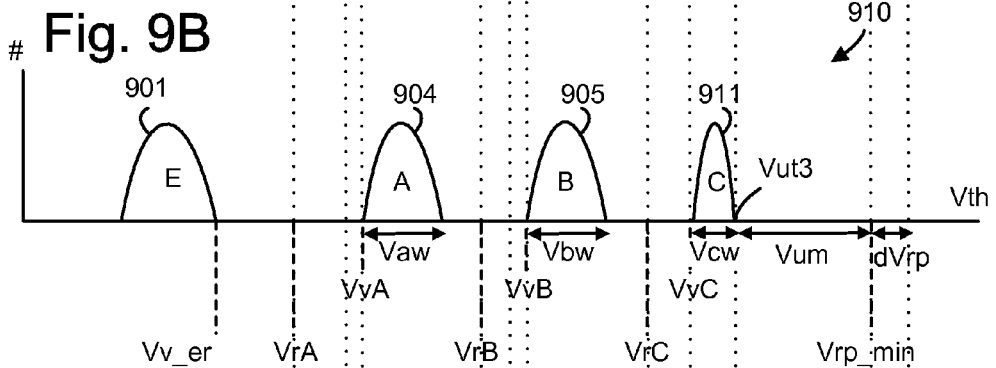
FIG. 9B depicts a Vth distribution with four data states, showing a narrower C-state Vth distribution compared to FIG. 9A.
Figure 9C:
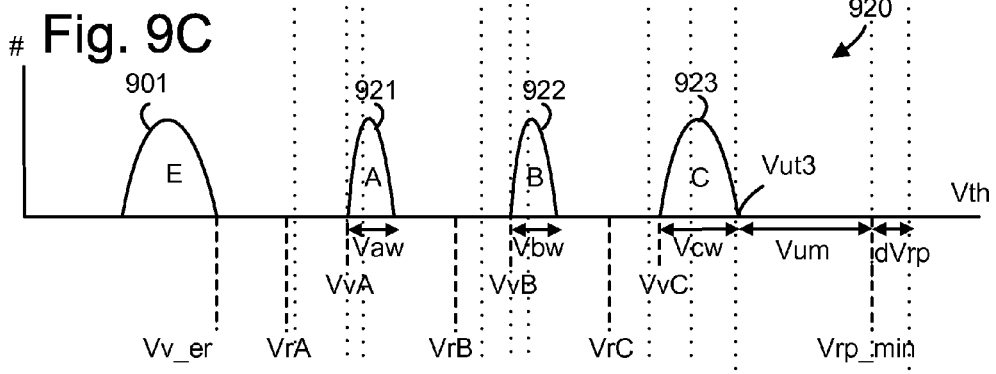
FIG. 9C depicts a Vth distribution with four data states, showing a narrower A- and B-state Vth distribution and a downshifted C-state Vth distribution, compared to FIG. 9A.
Figure 9D:
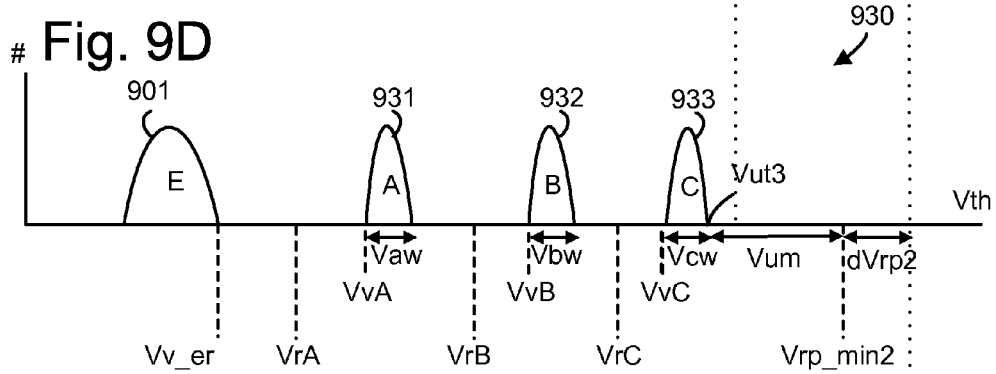
FIG. 9D depicts a Vth distribution with four data states, showing a narrower A-, B- and C-state Vth distribution compared to FIG. 9A.

A third path is a programming mode involving narrowing of all programmed data states (step 527), such as depicted in FIG. 9D. Vpgm is stepped up using a small or zero dVpgm, and/or by setting Vbl to slow programming for all data states at step 530.

A fourth path is a programming mode involving no narrowing of programmed data states (step 527), such as depicted in FIG. 9A. Vpgm is stepped up using a large dVpgm and Vbl is set normally.

Figure 5E:
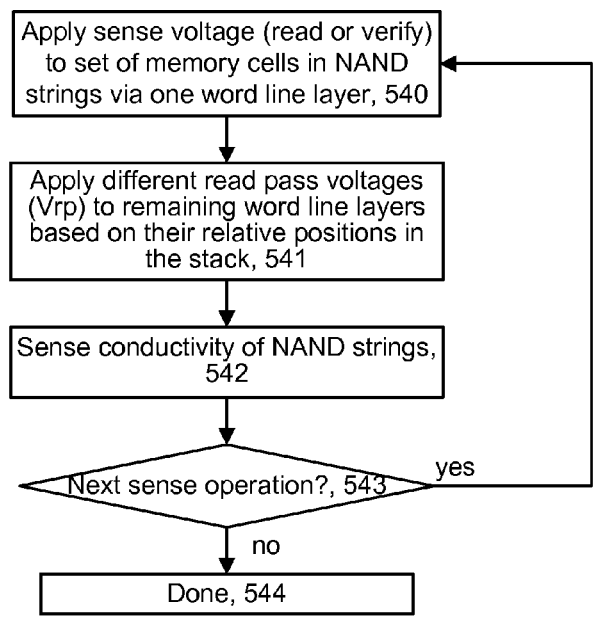
FIG. 5E depicts an example of the process for performing a sensing operation according to step 517 of FIG. 5C.

FIG. 5E depicts an example of the process for performing a sensing operation according to step 517 of FIG. 5C. Step 540 applies a sense voltage (e.g., a read or verify voltage) to a set of memory cells in NAND strings via one word line layer. Step 541 applies different read pass voltages (Vrp) to remaining word line layers based on their relative positions in the stack. Step 542 senses a conductivity of the NAND strings. Decision step 543 determines if there is a next sense operation. If there is none, the process is done at step 544. Otherwise, a next sense voltage is applied at step 540.

Figure 6A:
FIGS. 6A and 6B depict a one pass programming operation with four data states.
Figure 6B:
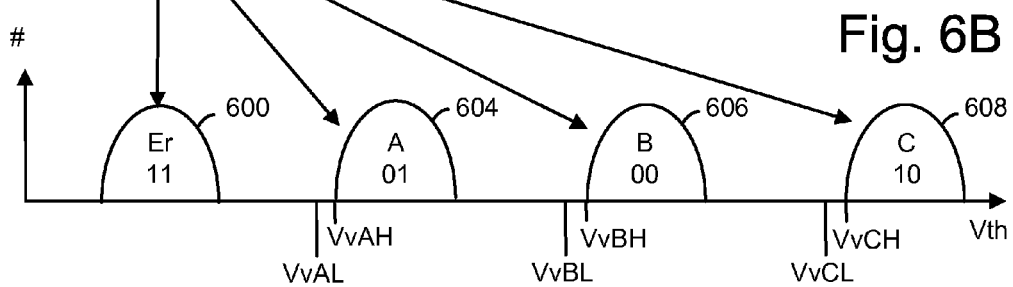

FIGS. 6A and 6B depict a one pass programming operation with four data states. One pass programming is also referred to as "one-pass write" programming which involves a sequence of multiple program-verify operations which are performed starting from an initial Vpgm level and proceeding to a final Vpgm level until the threshold voltages of a set of selected memory cells reach one or more respective verify levels of respective target data states. In one pass programming, all memory cells are initially in an erased state. Some of the memory cells are not programmed and remain in the erased state while others are programmed to higher target data states.

Example Vth distributions for the memory cell array are provided for a case where each memory cell stores two bits of data. Each graph depicts Vth on the horizontal axis and a number or population of memory cells in a Vth distribution on the vertical axis. One bit represents the LP data and the other bit represents the UP data. A bit combination can be denoted by the UP bit followed by the LP bit, e.g., 11 denotes UP=1 and LP=1, 01 denotes UP=0 and LP=1, 00 denotes UP=0 and LP=0 and 10 denotes UP=1 and LP=0. A first Vth distribution 600 is provided for erased (Er) state memory cells. Three Vth distributions 604, 606 and 608 represent target data states A, B and C, respectively, which are reached by memory cells when their Vth exceeds a higher verify level VvAH, VvBH or VvCH, respectively. In this case, each memory cell can store two bits of data in one of four possible Vth ranges, referred to as states Er (or E), A, B and C. A program option which uses a slow programming mode may be referred to as a "quick pass write" (QPW) technique. QPW can be used independently in one or more passes of a multiple pass programming technique. Although, generally, it is sufficient to use QPW in the final programming pass when accuracy is most important. QPW mode and slow programming mode are used interchangeably herein.

When QPW is used, lower verify levels (VvAL, VvBL or VvCL) are defined such that the memory cells enter a slow programming mode or zone (e.g., by raising the associated bit line voltages applied during program) when their Vth is between the lower verify level and the higher verify level of a respective target data state. The lower verify levels are offset below the respective higher verify levels, in one implementation. Specifically, when a verify test determines that the Vth of a memory cell exceeds the lower verify level associated with the target data state of the memory cell, a slow programming mode begins for the memory cell. Subsequently, when a verify test determines that the Vth of a memory cell exceeds the higher verify level associated with the target data state of the memory cell, the memory cell is inhibited from further programming. In some cases, QPW is used on fewer than all target data states.

The specific relationship between the data programmed into a memory cell and the Vth level of the memory cell depends upon the data encoding scheme adopted for the memory cells. In one embodiment, data values are assigned to the Vth ranges using a Gray code assignment so that if the Vth of a floating gate erroneously shifts to its neighboring physical state, only one bit will be affected. One example assigns "11," "01," "00" and "10" to the E, A, B- and C-states. Read reference voltages which are between the distributions are used for reading data from the memory cells. By testing whether the Vth of a given memory cell is above or below one or more of the read reference voltages, the system can determine the data state which is represented by a memory cell.

FIGS. 7A to 7C depict a two pass programming operation with four data states. Each pass can be used to program a page of data. For example, programming of lower and upper pages in two-bit, four-level memory cells is provided. Programming can be performed one logical page at a time, with the lower page followed by the upper page. Initially, all memory cells are in the Er state, represented by the distribution 700 in FIG. 7A.

FIG. 7B depicts programming of a lower page of data. If the lower page has a bit=1, the associated memory cell remains in the distribution 700 and the data is represented by x1, where x is an upper page bit that is not yet known. If the lower page has a bit=0, the memory cell is programmed to a higher Vth as represented by distribution 702, which is an interim distribution (INT), using a verify level Vv1. The data of these memory cells is represented by x0. Note that the interim distribution can be relatively wide since it is not a final distribution and does not represent a final data state.

FIG. 7C depicts programming of an upper page of data. If UP/LP=11, the associated memory cell in the distribution 700 remains in the distribution 700 and stores data bits 11. If UP/LP=01, the memory cells in the distribution 700 are programmed to the distribution 704 (state A) and a slow programming mode is used when the Vth is between VvAL VvAH. If UP/LP=10, the memory cells in the distribution 702 are programmed to the distribution 708 (state C) and a slow programming mode is used when the Vth is between VvCL and VvCH. If UP/LP=00, the memory cells in the distribution 702 are programmed to the distribution 706 (state B) and a slow programming mode is used when the Vth is between VvBL and VvBH.

Programming can be similarly extended to three or more bits per memory cell. For example, FIGS. 8A to 8D depict a three pass programming operation with normal and slow programming modes used on the third pass, and eight data states. Programming of lower, middle and upper pages in three-bit, eight-level memory cells is depicted. Seven programmed data states (A-G) are used in addition to Er for eight states total. Initially, all memory cells are in the Er state, represented by the distribution 800. The lower page is programmed in FIG. 8B. If LP=1, memory cells in distribution 800 remain in that distribution. If LP=0, memory cells in distribution 800 are programmed to an interim distribution 802 using Vv1. The middle page (MP) is programmed in FIG. 8C. If MP=1, memory cells in distribution 800 remain in that distribution, and memory cells in distribution 802 are programmed to interim distribution 808 using verify level Vv4. If MP=0, memory cells in distribution 800 are programmed to interim distribution 804 using verify level Vv2, and memory cells in distribution 802 are programmed to interim distribution 806 using verify level Vv3.

The upper page is programmed in FIG. 8D. QPW can be used for this pass. If UP=1, memory cells in distribution 800 remain in that distribution, memory cells in distribution 804 are programmed to distribution 814 (state C), memory cells in distribution 806 are programmed to distribution 816 (state D), and memory cells in distribution 808 are programmed to distribution 822 (state G). If UP=0, memory cells in distribution 800 are programmed to distribution 810 (state A), memory cells in distribution 804 are programmed to distribution 812 (state B), memory cells in distribution 806 are programmed to distribution 818 (state E), and memory cells in distribution 808 are programmed to distribution 820 (state F).

Programming using four bits per cell (16 levels) can similarly involve four pages. Additionally, when programming multiple pages of data, a back and forth word line order may be used to reduce potential disturbs from capacitive coupling.

FIG. 9A depicts a Vth distribution 900 with four data states, showing a reduction in a read window from Vrwd to Vrdw1 to Vrdw2 according to an increase in an upper tail of the erased state distribution from Vv_er to Vut1 to Vut2, respectively. The concepts shown through the example of four data states can be applied to memory devices using additional data states as well, e.g., 8 or 16 data states. A Vth distribution 901 is obtained after an erased operation. The erase operation can use a verify level of Vv_er. Due to read disturb, as discussed, the upper tail of the erased state can increase so that the Vth distribution 902 or 903 is seen after repeated reading. The upper tail is relatively higher for a set of memory cells with relatively many program-erase cycles and at a relatively narrower portion of a memory hole.

Figure 10A:
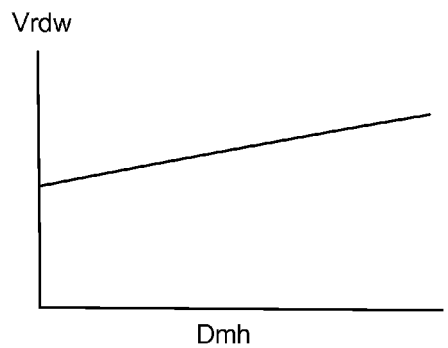
FIG. 10A is a graph depicting a reduction in a read window (Vrdw) as a function of a decrease in Dmh.

The Vth distributions 904, 905 and 906 represent normal, relatively wide distributions for the A-, B- and C-states, respectively, with widths of Vaw, Vbw and Vcw, respectively, and verify levels of VvA, VvB and VvC, respectively. Read levels are VrA, VrB and VrC. VvA, VvB and VvC, can be the same as VvAH, VvBH and VvCH, respectively, discussed previously. A read window can be defined as a difference between the upper tail of the erased state and the verify level of the highest state. For example, Vrdw is a read window between Vv_er and VvC, Vrdw1 is a read window between Vut1 and VvC and Vrdw2 is a read window between Vut2 and VvC, where Vrdw2<Vrdw1<Vrdw. The increase in the upper tail (or the decrease in the read window) can lead to E to A-state read failures. For example, the portion of the Vth distribution 903 which exceeds VrA represents memory cells which will be read incorrectly as being in the A-state instead of the E-state. FIG. 10A also indicates how the read window decreases as Dmh decreases.

Vrp_max is a maximum read pass voltage, and Vum is a margin between the upper tail Vut3 of the highest data state and Vrp_max. This margin should be maintained so that the C-state memory elements are strongly conductive during sensing. If this condition is met, the lower state memory elements will also be strongly conductive.

FIG. 9B depicts a Vth distribution 910 with four data states, showing a narrower Vcw compared to FIG. 9A. This approach allows a lower Vrp to be used while Vum is the same as in FIG. 9A. Vrp in this case is Vrp_min, a lowest level of Vrp which might be used for a word line layer adjacent to a narrowest portion of a memory hole. Vrp_max–Vrp_min=dVrp. Example approaches for setting Vrp as a function of Dmh are provided in FIGS. 10B-10D. VvA, VvB and VvC can be the same as in FIG. 9A.

This approach narrows the Vth distribution 911 of the highest data state without narrowing the Vth distributions of the lower data states (between the erase data state and the highest data state). The narrowing results in a lower Vut3. This is desirable because Vum is maintained and Vrp is lowered so that read disturb is lowered. As mentioned, a higher read pass voltage results in a greater increase in the upper tail of the erased state Vth distribution of the unselected memory cells during sense operations. As a result, the read pass window decreases. However, the read pass voltage cannot be reduced without modifying the highest state Vth distribution because of the margin Vum. A solution is to control the programming process so that a narrower Vth distribution is achieved for the C-state. This can result in a longer programming time since the C-state is typically the last state which completes programming, but this is an acceptable tradeoff for reducing read disturb. Moreover, the adjusted programming can be limited to selected word line layers associated with narrower memory holes, so that the tradeoff is smaller or not seen on other word line layers.

One approach is to use a smaller dVpgm during C-state programming. dVpgm can be changed to a smaller value in the middle of the programming, e.g., after the programming progresses to a milestone such as when the A-state finishes programming, or when a certain number of program pulses have been applied. See FIGS. 12A-12C. Another approach is to stop increasing Vpgm after the programming reaches a milestone. Thus, the Vpgm reaches a maximum level and then is fixed while the programming of the C-state is finished.

Figure 12A:
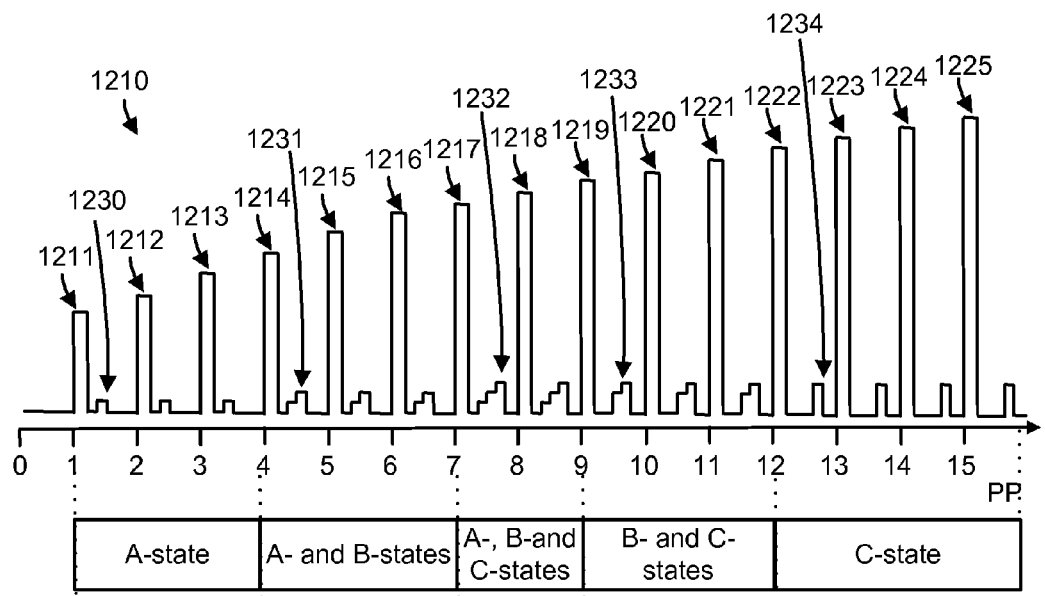
FIG. 12A depicts programming and sensing waveforms for a second pass of a two-pass programming operation such as in FIGS. 7A-7C, or for a programming operation such as in FIGS. 6A and 6B to achieve a narrow Vth distribution for the C-state such as in FIG. 9B.
Figure 12B:
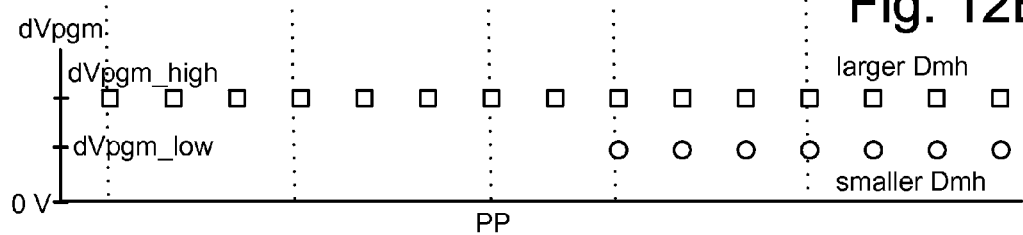
FIG. 12B depicts dVpgm used in the programming operation of FIG. 12A.
Figure 12C:
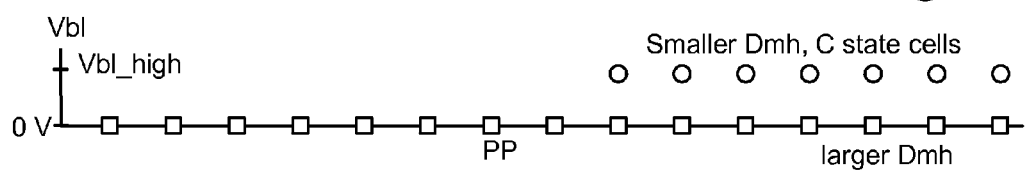
FIG. 12C depicts a bit line voltage (Vbl) for use with the program pulses of the programming operation of FIG. 12A.

Another approach is using quick pass write for the C-state as depicted in FIG. 12C. The various approaches can be combined as well.

Generally, the Vth distribution is narrowed by slowing the programming of the memory cells by reducing dVpgm and/or raising Vbl. Slowing the programming avoids large jumps in the Vth of a memory cell which lead to a wider Vth distribution.

This is an example of adjusting programming to provide a relatively lower upper tail (Vut3) of a Vth distribution for a highest programmed data state (e.g., C) of a plurality of programmed data states when the position of the one word line layer is adjacent to relatively narrower portions of the memory holes.

FIG. 9C depicts a Vth distribution 920 with four data states, showing a narrower Vaw and Vbw and a downshifted C-state Vth distribution, compared to FIG. 9A. This approach also allows a lower Vrp to be used while Vum is the same as in FIG. 9A. The Vrp is Vrp_min. VvC is lower than in FIG. 9A or 9B. This approach narrows the Vth distribution of the lower data states (921 and 922) without narrowing the Vth distribution 923 of the highest data state. This is desirable because Vum is maintained and Vrp is lowered so that read disturb is lowered. Also, programming time is not increased because programming of the C-state is not adjusted. Vrp can be lowered further by reducing VvA and VvB as shown relative to FIG. 9A to allow VvC to be shifted even low. VrA, VrB and VrC can also be lowered as shown here and as depicted in further detail in FIG. 10F. Maintaining additional sets of verify voltages for different word line layers can slightly increase the complexity. In one approach, a rule can be set to adjust the programming among the different word line layers while maintaining the same Vum and while providing a same minimum separation between data states (e.g., between the upper tail and lower tail of each pair of adjacent data states E/A, A/B and B/C).

One approach is to use a smaller dVpgm during B-state programming (and optionally during A-state programming as well). Note that one or more of the read levels may be adjusted. For example, with the lowering of VvC, and the narrowing of Vbw, VrC should be lowered as well compared to FIG. 9A. Generally, each read level should be at a midpoint between adjacent Vth distributions.

In an option, the programming is adjusted to narrow the Vth distribution of one (but not both) of the A- or B-states. When there are eight or sixteen data states, many other variations are possible. For example, the programming of a subset of the data states (comprising multiple data states but not all data states) can be adjusted to narrow the Vth distribution.

This is an example of programming one subset (e.g., the memory cells with the C-state as the target data state) of the set of memory cells to a highest programmed data state (e.g., the C-state) of a plurality of programmed data states (e.g., the A, B- and C-states) using a verify level (VvC) which is relatively lower when the position of the one word line layer is adjacent to relatively narrower portions of the memory holes. For example, the one subset in the SetD-0 in FIG. 2B4 can be one or more of MCD0-0, MCD0-1, MCD0-2, MCD0-14.

This is also an example of programming one subset (e.g., the memory cells with the A- or B-state as the target data state) of the set of memory cells to a lowest programmed data state (e.g., the A- or B-state) of a plurality of programmed data states, above an erased data state, using a verify level (VvA or VvB) which is relatively lower when the position of the one word line layer is adjacent to relatively narrower portions of the memory holes.

FIG. 9D depicts a Vth distribution 930 with four data states, showing a narrower Vaw, Vbw and Vcw compared to FIG. 9A. This allows Vrp to be lowered further compared to FIG. 9B or 9C, to Vrp_min2, where Vrp_max=Vrp min2=dVrp2, and dVrp2>dVrp1. The scale of the x-axis is the same in FIGS. 9A-9D. The Vth distributions 931, 932 and 933 can be achieved by slowing programming for each of the data states (A-C) for word line layers which are associated with a smaller Dmh. The programming can be slowed by adjusting the programming process using dVpgm and/or Vbl.

Alternatively, the Vth distributions can be achieved for these word line layers by fabricating the memory device so that these layers are thicker, as discussed previously, e.g., in connection with FIGS. 2D and 4C. A thicker word line layer results in a longer channel length Lcg for a memory cell. Further, the channel area of the memory cell increases with Lcg, and the capacitance C between the control gate and the charge trapping layer is proportional to the channel area. The capacitance thus also increases with Lcg. The Vth distribution can be modeled using a Poisson distribution where the standard deviation (SD) is: SD=square root of (q×dVpgm/C) and the q is an electron charge. Accordingly, it can be seen that SD decreases as C increases with Lcg. A larger Lcg therefore results in a narrower Vth distribution for all programmed data states. In other words, the program noise is reduced when Lcg is larger. The increase in the word line layer thickness can be limited to a portion of the stack to limit the increase in the height of the stack.

Figure 9E:
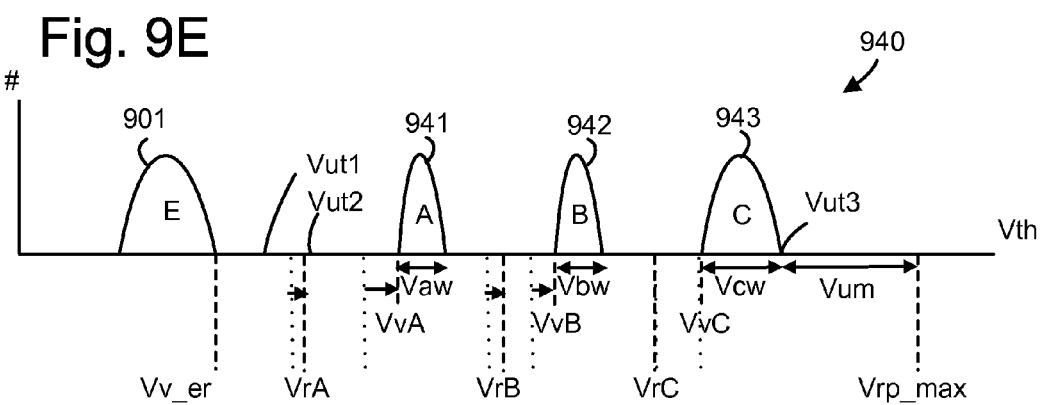
FIG. 9E depicts a Vth distribution with four data states, showing narrower and upshifted A- and B-state Vth distributions compared to FIG. 9A.

FIG. 9E depicts a Vth distribution with four data states, showing narrower and upshifted A- and B-state Vth distributions (941 and 942, respectively) compared to FIG. 9A. In this example, the read window is maintained even as the upper tail of the erased state increases for the memory cells near the narrower portions of the memory holes. Vum is also maintained. To achieve this, the verify levels of one or more lower programmed data states are increased as a function of Dmh. This is opposite to the decrease in FIG. 9C. The read pass voltage can be maintained at the maximum level. VrA and VrB can also be increased compared to FIG. 9A. The increases in the verify and read levels compared to FIG. 9A are shown by horizontal arrows. The values of Vut1 and Vut2 are also repeated for reference. By raising VvA, a larger spacing from Vut2 is provided, so that VrA can be raised, e.g., to a midpoint between Vut2 and VvA. As a result, fewer E to A-state read failures will occur.

This is an example of programming one subset of the set of memory cells to a lowest programmed data state (e.g., A) of a plurality of programmed data states, above an erased data state, using a verify level (VvA) which is relatively higher when the position of the one word line layer is adjacent to relatively narrower portions of the memory holes.

In one approach, VrA is raised and Vaw is narrowed but VrB is not raised. Since Vaw is narrowed, there will be a sufficient space between the upper tail of the A-state Vth distribution and VrB. However, optionally, VrB can be raised as well, in which case Vbw is narrowed to maintain a sufficient space between the upper tail of the B-state Vth distribution and VrC. VrC is not changed in this example, resulting the C-state Vth distribution 943.

Optionally, VrC is raised and Vcw is narrowed to maintain a sufficient space between the upper tail of the C-state Vth distribution (Vut3) and Vrp. In another option, Vbw is narrowed but not Vaw or Vcw, and VrA, VaA, VrB and VvB are increased.

Figure 9F:
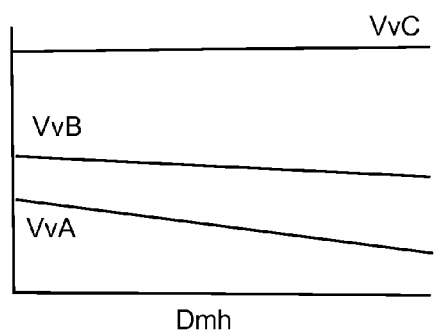
FIG. 9F depicts a variation in verify levels of one or more lower programmed data states as a function of Dmh, consistent with FIG. 9E.

FIG. 9F depicts a variation in verify levels of one or more lower programmed data states as a function of Dmh, consistent with FIG. 9E. In this example, VvC is fixed while VvA and VvB increase as Dmh becomes smaller. VvA can increase more than VvB as Dmh becomes smaller.

FIG. 10A is a graph depicting a reduction in a read window (Vrdw) as a function of a decrease in Dmh. As mentioned, for a given Vrp, Vrdw is smaller when Dmh is smaller because the Vrp has a stronger effect, if no adjustments are made as described herein. The techniques provided herein can maintain the read window at a uniform level which is substantially independent of Dmh.

Figure 10D:
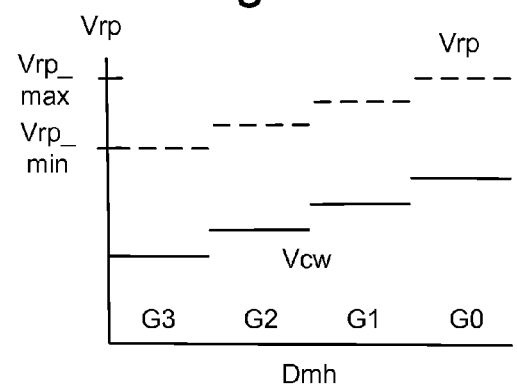
FIG. 10D is a graph which provides a four-level simplification of Vrp and Vcw in FIG. 10B.
Figure 10B:
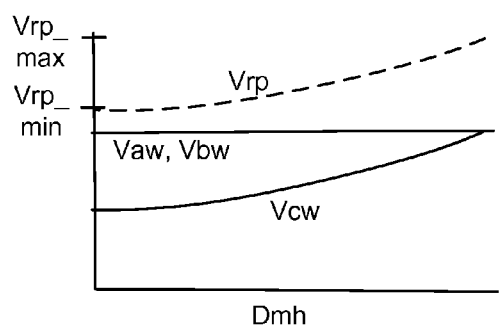
FIG. 10B is a graph depicting a reduction in a read pass voltage (Vrp) which is achieved by a gradual reduction in a C-state Vth distribution (Vcw) as a function of a decrease in Dmh, while an A-state Vth distribution (Vaw) and a B-state Vth distribution (Vbw) are constant.

FIG. 10B is a graph depicting a reduction in a read pass voltage (Vrp) which is used with a gradual reduction in a C-state Vth distribution (Vcw) as a function of a decrease in Dmh, while Vaw and Vbw are constant, consistent with FIG. 9C. A lower Vrp is used when Dmh is smaller and a larger Vrp is used when Dmh is larger. The programming of the C-state is adjusted for different values of Dmh (e.g., for different word line layers) to provide a smaller Vcw when Dmh is lower and to provide a larger Vcw when Dmh is larger.

Figure 10E:
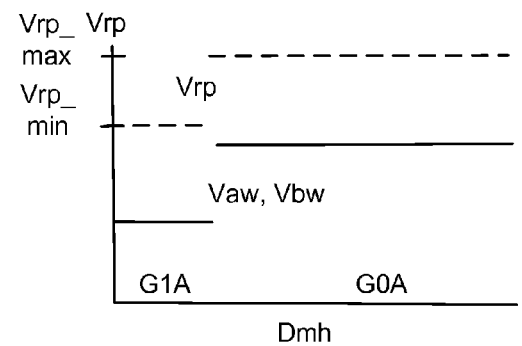
FIG. 10E is a graph which provides a two-level simplification of Vaw, Vbw and Vrp in FIG. 10B.
Figure 10C:
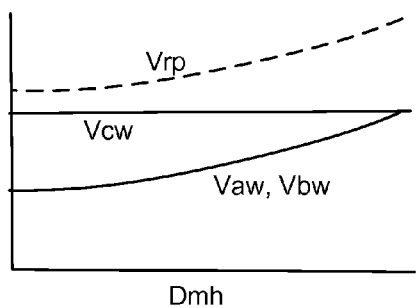
FIG. 10C is a graph depicting a reduction in a read pass voltage (Vrp) which is achieved by a gradual reduction in an A-state Vth distribution (Vaw) and a B-state Vth distribution (Vbw) as a function of a decrease in Dmh, while a C-state Vth distribution (Vcw) is constant.

FIG. 10C is a graph depicting a reduction in a read pass voltage (Vrp) which is used with a gradual reduction in Vaw and Vbw as a function of a decrease in Dmh, while Vcw is constant, consistent with FIG. 9C. The programming of the A- and B-states is adjusted for different values of Dmh to provide a smaller Vaw and Vbw when Dmh is lower and to provide a larger Vaw and Vbw when Dmh is larger.

FIG. 10D is a graph which provides a four-level simplification of Vrp and Vcw in FIG. 10B. To simplify the implementation, a few, e.g., four, ranges of Dmh can be used, so that a corresponding four ranges of adjacent word line layers can be grouped and each group programmed using common programming conditions. For instance, groups G0-G3 may be used as discussed previously. Any number of groups can be used and they can be the same size (encompassing the same number of word line layers) and/or different sizes.

FIG. 10E is a graph which provides a two-level simplification of Vaw, Vbw and Vrp in FIG. 10B. This provides a further simplification by using just two levels encompassing groups G0A and G1A.

Figure 10F:
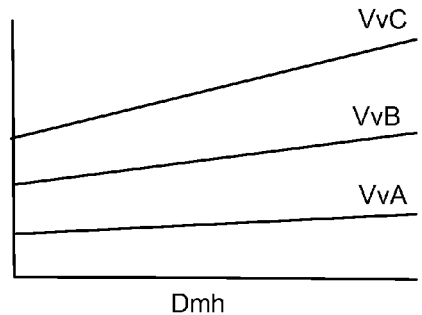
FIG. 10F depicts a variation in verify levels of programmed data states as a function of Dmh, consistent with FIG. 9C.

FIG. 10F depicts a variation in verify levels of programmed data states as a function of Dmh, consistent with FIG. 9C. As discussed, the verify levels (e.g., VrA, VrB and VrC) can be lowered when Dmh is lower. Further, the verify levels of the higher data states can be lowered relatively more than the verify levels of the lower data states. The verify level can vary linearly or non-linearly with Dmh.

Figure 11A:
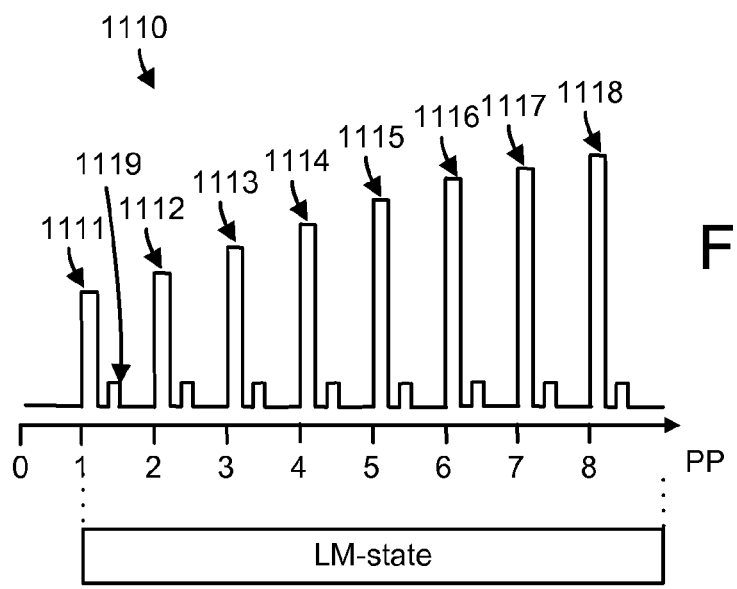
FIG. 11A depicts programming and sensing waveforms for a first pass of a two-pass programming operation such as in FIGS. 7A-7C.

FIG. 11A depicts programming and sensing waveforms for a first pass of a two-pass programming operation such as in FIGS. 7A-7C. The horizontal axis depicts the program pulse (PP) number and the vertical axis depicts a control gate or word line voltage. Generally, a programming operation can involve applying a pulse train to a selected word line layer, where the pulse train includes multiple program-verify iterations. The program portion of the program-verify iteration comprises a program pulse, and the verify portion of the program-verify iteration comprises one or more verify pulses.

A pulse train typically includes program pulses which increase stepwise in amplitude in each program-verify iteration using a fixed or varying step size. A new pulse train can be applied in each programming pass, starting at an initial level and ending at a final level which does not exceed a maximum allowed level. The initial levels can be the same or different in different programming passes. The final levels can also be the same or different in different programming passes. The step size can be the same or different in the different programming passes. In some cases, a smaller step size is used in a final programming pass to reduce Vth distribution widths.

The pulse train 1110 includes a series of program pulses 1111-1118 that are applied to a word line layer selected for programming and to an associated selected set of non-volatile memory cells. In this case, one verify pulse 1119 at VvLM is provided after each program pulse since the programming is to the LM state.

Figure 11B:
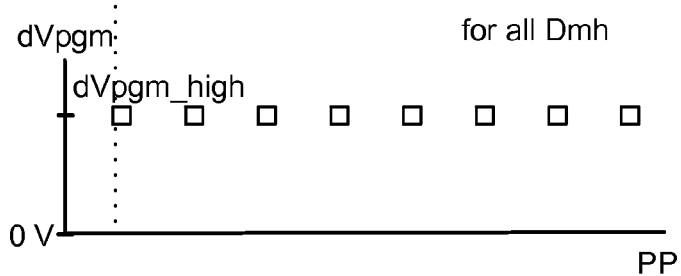
FIG. 11B depicts a fixed dVpgm used in the programming operation of FIG. 11A.

FIG. 11B depicts a fixed dVpgm used in the programming operation of FIG. 11A. The scale of the x-axis is the same in FIGS. 11A and 11B. dVpgm can be kept at a high level (dVpgm_high) throughout the program pass since the main goal is complete programming as soon as possible and since achieving a narrow Vth distribution is not important. Each square represents dVpgm for a program pulse.

FIG. 12A depicts programming and sensing waveforms for a second pass of a two-pass programming operation such as in FIGS. 7A-7C, or for a programming operation such as in FIGS. 6A and 6B to achieve a narrow Vth distribution for the C-state such as in FIG. 9B.

The pulse train 1210 includes a series of program pulses 1211-1225 that are applied to a word line layer selected for programming and to an associated selected set of non-volatile memory cells. This example performs verify operations selectively based on the expected programming progress. An A-state verify pulse (e.g., waveform 1230) may be applied after each of the first-third program pulses. A- and B-state verify pulses (e.g., waveform 1231) may be applied after each of the fourth-sixth program pulses. A-, B- and C-state verify pulses (e.g., waveform 1232) may be applied after each of the seventh and eighth program pulses. B- and C-state verify pulses (e.g., waveform 1233) may be applied after each of the ninth-eleventh program pulses. Finally, a C-state verify pulse (e.g., waveform 1234) may be applied after each of the twelfth-fifteenth program pulses. In this example, the A-state memory cells complete programming after the eighth program pulse and the B-state memory cells complete programming after the eleventh program pulse.

FIG. 12B depicts dVpgm used in the programming operation of FIG. 12A. The scale of the x-axis is the same in FIGS. 12A-12C. Before PP9, each square represents dVpgm=dVpgm_high for a program pulse when programming memory cells regardless of the associated value of Dmh. From PP9-PP15, each square represents dVpgm=dVpgm_high for a program pulse if the memory cells are associated with a larger Dmh. Each circle represents dVpgm=dVpgm_low for a program pulse if the memory cells are associated with a smaller Dmh. Values of dVpgm which are between dVpgm_low and dVpgm_high can be used for intermediate values of Dmh. dVpgm_low can be zero or more Volts.

For the case of a smaller Dmh, the programming of the C-state memory cells will be slowed down by the lower Vpgm, resulting in a narrower Vth distribution. The A-state memory cells will complete programming to the normal Vth distribution. The programming of some of the B-state memory cells may be slowed down so that their Vth distribution is a little narrower than normal but not as narrow as for the C-state. In this example, the transition to the narrower Vth distribution for the memory cells associated with a smaller Dmh begins when programming of the A-state is complete. This is an example of reducing dVpgm beginning partway through the series of program pulses based on an adaptive decision which is made according to a program progress of the set of memory cells. Alternatively, dVpgm is reduced beginning at a fixed program pulse number (e.g., PP9) in the series of program pulses.

FIG. 12C depicts Vbl for use with the program pulses of the programming operation of FIG. 12A. To slow down programming, an alternative to reducing dVpgm is increasing Vbl. Both may be used as well. Vbl can be set for each memory cell separately so that it can be used to slow down programming for memory cells of one or more selected data states without slowing down the programming of other memory cells.

Before PP9, each square represents Vbl=0 V during a program pulse when programming memory cells regardless of the associated value of Dmh. From PP9-PP15, each square represents Vbl=0 V during a program pulse if the programming is for memory cells associated with a larger Dmh. Each circle represents Vbl=Vbl_high (e.g., 1 V) during a program pulse if the programming is for memory cells associated with a smaller Dmh. Values of Vbl which are between 0 V and Vbl_high can be used for intermediate values of Dmh.

For the case of a smaller Dmh, the programming of the C-state memory cells will be slowed down by the higher Vbl, resulting in a narrower Vth distribution. The A-state memory cells will complete programming to the normal Vth distribution. The programming of the B-state memory cells need not be slowed down since the higher Vbl is limited to use on the C-state memory cells in this example. This is an example of increasing Vbl beginning partway through the series of program pulses based on an adaptive decision which is made according to a program progress of the set of memory cells. Alternatively, Vbl is increased beginning at a fixed program pulse number (e.g., PP9) in the series of program pulses.

Another option is to use multiple levels of Vbl to slow the programming of a given set of memory cells on one word line layer. In this case, Vbl is raised to an intermediate level initially (between 0 V and Vbl_high) and then to Vbl_high as the programming progresses.

FIGS. 12B and 12C are examples of programming one subset (e.g., the memory cells with the C-state as the target data state) of the set of memory cells to a highest programmed data state (e.g., C-state) of a plurality of programmed data states at a rate which is relatively slower when the position of the one word line layer is adjacent to relatively narrower portions of the memory holes.

Figure 13A:
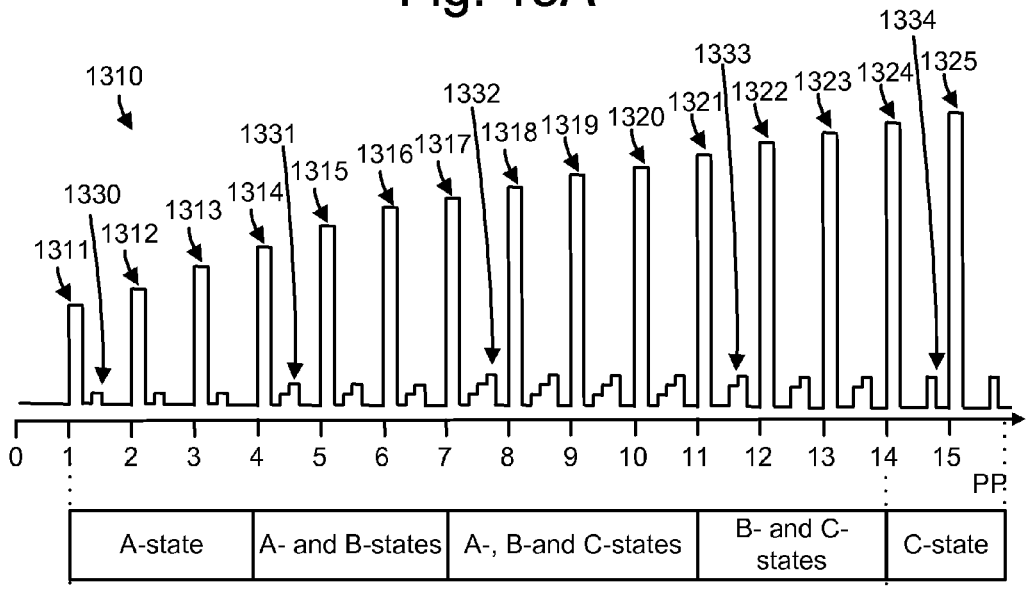
FIG. 13A depicts alternative programming and sensing waveforms for a second pass of a two-pass programming operation such as in FIGS. 7A-7C, or for a programming operation such as in FIGS. 6A and 6B to achieve a narrow Vth distribution for the A- and B-states such as in FIG. 9C

FIG. 13A depicts alternative programming and sensing waveforms for a second pass of a two-pass programming operation such as in FIGS. 7A-7C, or for a programming operation such as in FIGS. 6A and 6B to achieve a narrow Vth distribution for the A- and B-states such as in FIG. 9C.

The pulse train 1310 includes a series of program pulses 1311-1325 that are applied to a word line layer selected for programming and to an associated set of non-volatile memory cells. This example performs verify operations selectively based on the expected programming progress as with FIG. 12A, except that additional program pulses are used to complete programming of the A- and B-states to achieve a narrower Vth distribution.

An A-state verify pulse (e.g., waveform 1330) may be applied after each of the first-third program pulses. A- and B-state verify pulses (e.g., waveform 1331) may be applied after each of the fourth-sixth program pulses. A-, B- and C-state verify pulses (e.g., waveform 1332) may be applied after each of the seventh-tenth program pulses. B- and C-state verify pulses (e.g., waveform 1333) may be applied after each of the eleventh-thirteenth program pulses. Finally, a C-state verify pulse (e.g., waveform 1334) may be applied after each of the fourteenth and fifteenth program pulses. In this example, the A-state memory cells complete programming after the tenth program pulse and the B-state memory cells complete programming after the thirteenth program pulse.

Figure 13B:
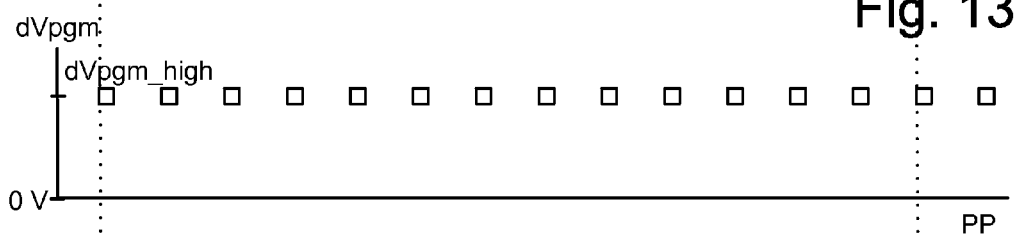
FIG. 13B depicts dVpgm used in the programming operation of FIG. 13A.

FIG. 13B depicts dVpgm used in the programming operation of FIG. 13A. The scale of the x-axis is the same in FIGS. 13A-13C. Each square represents dVpgm=dVpgm_high for each program pulse. In this case, programming speed is not controlled by dVpgm.

Figure 13C:
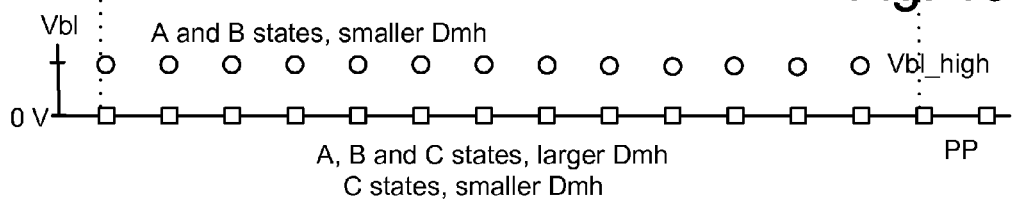
FIG. 13C depicts Vbl for use with the program pulses of the programming operation of FIG. 13A.

FIG. 13C depicts Vbl for use with the program pulses of the programming operation of FIG. 13A. Each square represents Vbl=0 V during a program pulse when programming memory cells for each of the A, B and C data states if the memory cells are associated with a larger Dmh, and when programming memory cells for the C-state if the memory cells are associated with a smaller Dmh. Since Vbl=0 V in all cases for the C-state, a normal Vth distribution for the C-state is achieved.

Each circle represents Vbl=Vbl_high during a program pulse when programming memory cells for each of the A- and B-data states if the memory cells are associated with a smaller Dmh. A narrower Vth distribution for the A- and B-states is therefore achieved.

Accordingly, it can be seen that, in one embodiment, a method for programming a 3d non-volatile memory device comprises: selecting a set of memory cells in one word line layer of a plurality of word line layers to store data, the plurality of word line layers are arranged alternatingly with dielectric layers in a stack, and memory cells in the set of memory cells in the one word line layer are arranged in respective memory holes which extend through the stack, the respective memory holes having respective widths which vary along the memory holes; and programming the set of memory cells in the one word line layer, the programming is adjusted based on a position of the one word line layer in the stack.

In another embodiment, a 3D non-volatile memory device comprises: a plurality of word line layers arranged alternatingly with dielectric layers in a stack; a plurality of memory cells arranged in NAND strings and in communication with the plurality of word line layers, the NAND strings are arranged in respective memory holes which extend through the stack, the respective memory holes having respective widths which vary along the memory holes; and a control circuit. The control circuit selects a set of memory cells in one word line layer of the plurality of word line layers to store data, and programs the set of memory cells in the one word line layer, the programming is adjusted based on a position of the one word line layer in the stack.

In another embodiment, a method for programming a 3d non-volatile memory device comprises: selecting a set of memory cells in one word line layer of a plurality of word line layers to sense data, the plurality of word line layers are arranged alternatingly with dielectric layers in a stack, and memory cells in the set of memory cells in the one word line layer are arranged in respective memory holes which extend through the stack, the respective memory holes having respective widths which vary along the memory holes; and sensing the set of memory cells in the one word line layer, the sensing comprises applying a sense voltage to the one word line layer while applying read pass voltages (Vrp) to remaining word line layers of the plurality of word line layers, the read pass voltages are set based on relative positions of the remaining word line layers in the stack.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for programming a 3d non-volatile memory device, comprising:
    selecting a set of memory cells in one word line layer of a plurality of word line layers to store data, the plurality of word line layers are arranged alternatingly with dielectric layers in a stack, and memory cells in the set of memory cells in the one word line layer are arranged in respective memory holes which extend through the stack, the respective memory holes having respective widths which vary along the memory holes; and
    programming the set of memory cells in the one word line layer, the programming is adjusted based on a position of the one word line layer in the stack.

2. The method of claim 1, wherein:
    the programming is adjusted to provide a relatively narrower threshold voltage distribution for a highest programmed data state of a plurality of programmed data states when the position of the one word line layer is adjacent to relatively narrower portions of the memory holes.

3. The method of claim 1, wherein:
    the programming is adjusted to provide a relatively lower upper tail of a threshold voltage distribution for a highest programmed data state of a plurality of programmed data states when the position of the one word line layer is adjacent to relatively narrower portions of the memory holes.

4. The method of claim 1, wherein:
    the respective widths are progressively smaller closer to a bottom of the stack.

5. The method of claim 1, wherein:
    the programming is adjusted by programming one subset of the set of memory cells to a highest programmed data state of a plurality of programmed data states using a verify level which is relatively lower when the position of the one word line layer is adjacent to relatively narrower portions of the memory holes.

6. The method of claim 1, wherein:
    the programming is adjusted by programming one subset of the set of memory cells to a lowest programmed data state of a plurality of programmed data states, above an erased data state, using a verify level which is relatively higher when the position of the one word line layer is adjacent to relatively narrower portions of the memory holes.

7. The method of claim 1, wherein:
    the programming is adjusted by programming one subset of the set of memory cells to a highest programmed data state of a plurality of programmed data states at a rate which is relatively slower when the position of the one word line layer is adjacent to relatively narrower portions of the memory holes.

8. The method of claim 7, wherein:
    the programming of the set of memory cells comprises applying a series of program pulses to the set of memory cells; and
    the programming of the one subset of the set of memory cells at the rate which is relatively slower is achieved by adjusting bit line voltages for the one subset of the set of memory cells during one or more of the program pulses.

9. The method of claim 8, wherein:
    the adjusting of the bit line voltages begins partway through the series of program pulses based on a fixed program pulse number in the series of program pulses or based on an adaptive decision which is made according to a program progress of the set of memory cells.

10. The method of claim 7, wherein:
    the programming of the set of memory cells comprises applying a series of program pulses to the set of memory cells; and
    the programming of the one subset of the set of memory cells at the rate which is relatively slower comprises reducing a step size of one or more of the program pulses to a zero or non-zero value.

11. The method of claim 10, wherein:
    the reducing of the step size begins partway through the series of program pulses based on a fixed program pulse number in the series of program pulses or based on an adaptive decision which is made according to a program progress of the set of memory cells.

12. The method of claim 1, further comprising:
    after the programming of the set of memory cells, sensing another set of memory cells in another word line layer of the plurality of word line layers, the sensing the another set of memory cells comprises applying a sense voltage to the another word line layer while applying a read pass voltage to the one word line layer, the read pass voltage is set based on the position of the one word line layer in the stack, and the read pass voltage is relatively lower when the position of the one word line layer in the stack is adjacent to relatively narrower portions of the memory holes.

13. The method of claim 1, wherein:
    the memory holes are columnar and extend at least from a top word line layer of the plurality of word line layers to a bottom word line layer of the plurality of word line layers.

14. A 3d non-volatile memory device, comprising:
    a plurality of word line layers arranged alternatingly with dielectric layers in a stack;
    a plurality of memory cells arranged in NAND strings and in communication with the plurality of word line layers, the NAND strings are arranged in respective memory holes which extend through the stack, the respective memory holes having respective widths which vary along the memory holes; and
    a control circuit, the control circuit is configured to select a set of memory cells in one word line layer of the plurality of word line layers to store data, and programs the set of memory cells in the one word line layer, the programming is adjusted based on a position of the one word line layer in the stack.

15. The 3d non-volatile memory device of claim 14, wherein:

the programming is adjusted to provide a relatively narrower threshold voltage distribution for a highest programmed data state of a plurality of programmed data states when the position of the one word line layer is adjacent to relatively narrower portions of the memory holes.

16. The 3d non-volatile memory device of claim 14, wherein:
the programming is adjusted by programming one subset of the set of memory cells to a highest programmed data state of a plurality of programmed data states using a verify level which is relatively lower when the position of the one word line layer is adjacent to relatively narrower portions of the memory holes.

17. The 3d non-volatile memory device of claim 14, wherein:
the programming is adjusted by programming one subset of the set of memory cells to a lowest programmed data state of a plurality of programmed data states, above an erased data state, using a verify level which is relatively higher when the position of the one word line layer is adjacent to relatively narrower portions of the memory holes.

18. The 3d non-volatile memory device of claim 14, wherein:
the control circuit, after the programming of the set of memory cells, is configured to sense another set of memory cells in another word line layer of the plurality of word line layers, the sensing the another set of memory cells comprises applying a sense voltage to the another word line layer while applying a read pass voltage to the one word line layer, the read pass voltage is set based on the position of the one word line layer in the stack, the read pass voltage is relatively lower when the position of the one word line layer in the stack is adjacent to relatively narrower portions of the memory holes.

19. The 3d non-volatile memory device of claim 14, wherein:
the plurality of word line layers have a uniform thickness.

20. A method for programming a 3d non-volatile memory device, comprising:
selecting a set of memory cells in one word line layer of a plurality of word line layers to sense data, the plurality of word line layers are arranged alternatingly with dielectric layers in a stack, and memory cells in the set of memory cells in the one word line layer are arranged in respective memory holes which extend through the stack, the respective memory holes having respective widths which vary along the memory holes; and
sensing the set of memory cells in the one word line layer, the sensing comprises applying a sense voltage to the one word line layer while applying read pass voltages to remaining word line layers of the plurality of word line layers, the read pass voltages are set based on relative positions of the remaining word line layers in the stack.

21. The method of claim 20, wherein:
for at least one of the remaining word line layers, the read pass voltage is set relatively lower when the position of the at least one of the remaining word line layers in the stack is adjacent to relatively narrower portions of the memory holes.

22. The method of claim 20, wherein:
memory cells of the at least one of the remaining word line layers are programmed to a plurality of programmed data states; and
a highest programmed data state of the plurality of programmed data states has a relatively lower upper tail of a threshold voltage distribution when the position of the at least one of the remaining word line layers in the stack is adjacent to relatively narrower portions of the memory holes.

* * * * *